United States Patent [19]

Nelson

[11] Patent Number: 5,563,819
[45] Date of Patent: Oct. 8, 1996

[54] FAST HIGH PRECISION DISCRETE-TIME ANALOG FINITE IMPULSE RESPONSE FILTER

[75] Inventor: David A. Nelson, Fort Collins, Colo.

[73] Assignee: Cirrus Logic, Inc., Fremont, Calif.

[21] Appl. No.: 360,539

[22] Filed: Dec. 21, 1994

Related U.S. Application Data

[63] Continuation-in-part of Ser. No. 221,070, Mar. 31, 1994, abandoned.

[51] Int. Cl.⁶ .................................................. G06G 7/02
[52] U.S. Cl. .................................................. 364/825
[58] Field of Search .................................. 364/825, 602, 364/606

[56] References Cited

U.S. PATENT DOCUMENTS

| | | | |
|---|---|---|---|
| 4,316,258 | 2/1982 | Berger | 364/825 |
| 4,318,080 | 3/1982 | Yoshida | 364/825 |
| 4,475,170 | 10/1984 | Haque | 364/825 |

OTHER PUBLICATIONS

Haque and Copeland, "An Electrically Programmable Transversal Filter", International Electron Devices Meeting, Dec. 1976, pp. 27–30.
Tiemann, Engeler, and Baertsch, "A Surface Charge Correlator", IEEE Journal of Solid State Circuits, vol. SC–9, pp. 403–410, Dec. 1974.

*Primary Examiner*—Tan V. Mai
*Attorney, Agent, or Firm*—Howard S. Sheerin

[57] ABSTRACT

A high precision fast finite impulse response (FIR) filter which periodically samples an analog input signal and holds a sequentially-replaced number of the resulting discrete-time analog values in fixed storage cells while each value is being multiplied by a number of digital weights. The discrete-time analog values are not passed through delay devices and therefore do not degrade. The weights are stored in a memory or shift register and supplied to the multipliers in a repeating sequence. A predetermined number of the weights are set to zero to increase the setup time of the analog multipliers thereby increasing the precision without slowing the clocking frequency.

48 Claims, 13 Drawing Sheets

$$y(n) = \sum_{k=0}^{N-1} W(n)x(n-k)$$

$y(3) = W(3)x(0) + W(2)x(1) + W(1)x(2) + W(0)x(3)$ $$I_d = \frac{1}{2} k \frac{W}{L} (V_{gs} - V_T)^2$$

FAST HIGH PRECISION DISCRETE-TIME ANALOG FINITE IMPULSE RESPONSE FILTER

This application is a continuation-in-part of U.S. patent application Ser. No. 08/221,070 filed Mar. 31, 1994 now abandoned.

FIELD OF INVENTION

The present invention relates to electrical filters and more particularly to discrete time analog finite impulse response filters.

BACKGROUND OF THE INVENTION

Electrical filters are used for shaping and modifying electrical signals. One of the most common uses is to filter out, or remove, signal components of a particular frequency or range of frequencies, hence the name. They are sometimes used to process received signals to remove degradation factors often present after a signal transmission so that the received signals take an expected form and thereby produce an expected result. Examples of filter use include audio devices where filters are used to improve the reproduction of the expected sound, in video devices to produce the expected picture, and in data processing devices to produce the correct data.

Finite impulse response (FIR) filters are versatile signal processing devices whose filter characteristics are determined by a set of multiplying parameters rather than by physical components as in traditional analog filters. The multiplying parameters are frequently programmable values stored in a digital memory device so that they can be changed to easily alter the filter's characteristics. By altering the characteristics of the filter, it can be made to produce a better representation of the ideal signal despite variations in degradation factors.

In real-time signal processing, the input to an FIR filter is a sequence of discrete time values, x(n) (wherein a single sample value is denoted Ai), which may result from the periodic sampling of a continuous analog signal. The index n is an integer representing the sequence number of the current sample. Earlier samples are represented by lower numbers; for example, the $k^{th}$ preceding sample is represented by x(n− k). The FIR output signal is a sequence of discrete-time values y(n) each made up of the sum of a finite number (N) of products. Each product consists of the current sample and N−1 earlier samples x(n−k) multiplied by N constant coefficients W(k), where k is an index ranging from 0 to N−1. The multiplier coefficients or "weight factors," W(k) are the numerical parameters which are used to shape and modify the input signal so as to better achieve the expected result. Stated in the form of an equation, the FIR output signal function is:

$$y(n) = \sum_{k=0}^{N-1} W(k)x(n-k).$$

Traditionally, the FIR function has been implemented by passing the input signal samples x(n) through multiple stages of delay and taking a signal from the input and another signal after each stage of delay as input signals to the multipliers containing the weights. In the prior art, delay stages have taken many forms ranging from tapped delay lines to analog shift registers to digital shift registers supplied by analog-to-digital converters. These forms can be divided into the two main classifications of analog and digital delay devices. Analog delay devices are relatively simple and fast and permit the use of analog multipliers which may also be relatively fast and simple. However, in analog delay devices the signal degrades as it progresses down the delay path and the degradation may be significant, especially when the number of stages is large. Digital delay devices do not have the degradation problem since the analog input signal is converted to a digital, i.e., numerical, representation. As the digital representation is passed down the delay line it does not change in value. However, digital filters are relatively complex and slow in that they require analog-to-digital conversion of the input signal and digital multiplication of the signal by the weight factors W(k). The time needed to multiply digital numbers increases significantly with the length of the digital representation. Also, in the case where analog output is required, the digital signal must be converted back to analog form.

Another design consideration is to implement the FIR filter with a high degree of accuracy. If analog multipliers are used to implement the filter, they require a certain amount of settling time to achieve a desired accuracy. That is, after a new analog sample Ai is applied to the multiplier, a delay known as the setup time directly affects the accuracy of the multiplication result. The longer the setup time, the more time the multiplier has to settle, and the more accurate the result. A longer setup time, however, reduces the overall speed of conventional FIR filters.

To summarize, analog-delay FIR filters are fast and simple devices but suffer from degradation of the input signal as it progresses down a delay line. Digital-delay FIR filters are free of degradation but are relatively slow and complex devices, particularly where accuracy requires lengthy digital representation of the input signal and the weighting factors.

It is, therefore, a general object of the current invention to provide an FIR filter that is fast, accurate, and free of degradation.

SUMMARY OF THE INVENTION

In the present invention, an analog filter circuit is provided in which it is unnecessary to pass the input signal through a delay line. Instead, the analog input signal is periodically sampled and each sample is stored in one of N analog sample storage devices. When the last of a group of N samples is stored, the process is repeated in the same sequence thereby replacing the value stored in each sample storage device once every N sample periods. The value stored in each sample storage device is the "multiplicand" input to a corresponding one of N analog multiplier circuits whose "multiplier" input is one of N weighting factors from a weight storage device. The N weighting factor inputs for the N multiplier circuits are supplied from a memory device. Each of the N weighting factors is sequentially connected to a different multiplier circuit each sample period. The outputs of the multiplier circuits are the inputs to a summing circuit whose output is the output signal of the filter.

In operation, the N weights are circulated through the N multiplier circuits, completing a cycle every N sample periods. During each sample period, each of the stored sample values is multiplied by a different weight and the products of all the multiplier circuits are added to form the output signal. Then a sample is taken and stored (in the next sample storage device in the sequence), the weights are rotated one position, and another multiplication and summation is performed. In this way, each stored sample is multiplied by all the weights within one cycle of N sample periods.

Succinctly stated, during each sample period the vector of all the stored sample values is multiplied by a vector of all the digital weights; then, as a new sample is taken, the elements of the weight vector are rotated and the process repeats.

Basically, in the present invention, the analog input signal is sampled and each sample held in one storage device without degradation until it is no longer needed while the multiplying factors, i.e., the weights, are stored values which are repeatedly sequenced from one multiplier to another. Preferably, digital weighting factors are used, with digital words representing the weighting factors. The result is that the analog input signal can be processed without degradation at the speed, and with the simplicity, of analog multipliers.

In order to increase the accuracy of the filter's analog multiplying circuits, the setup time for the multipliers is increased without reducing the speed (clocking frequency) of the filter. This is accomplished by setting a predetermined consecutive number of the digital weights to zero so that when a new analog sample is applied to a multiplier during the above described sequence, the output of the multiplier is zero until a non-zero weight value is applied to its input. For instance, if there are T total weight values, then the first 0→n weights are set to zero, and the last (n+1)→(T−1) weights are the actual filter weights. This allows the multiplier to settle for a number of clock periods equal to the number of digital weights set to zero before multiplication by the actual (non-zero) filter weights begins.

BRIEF DESCRIPTION OF THE DRAWING

The above-mentioned and other features and objects of the invention and the manner of attaining them will become more apparent and the invention itself will best be understood by reference to the following description of embodiments of the invention taken in conjunction with the accompanying drawing, a brief description of which follows.

DETAILED DESCRIPTION

Figure 1:
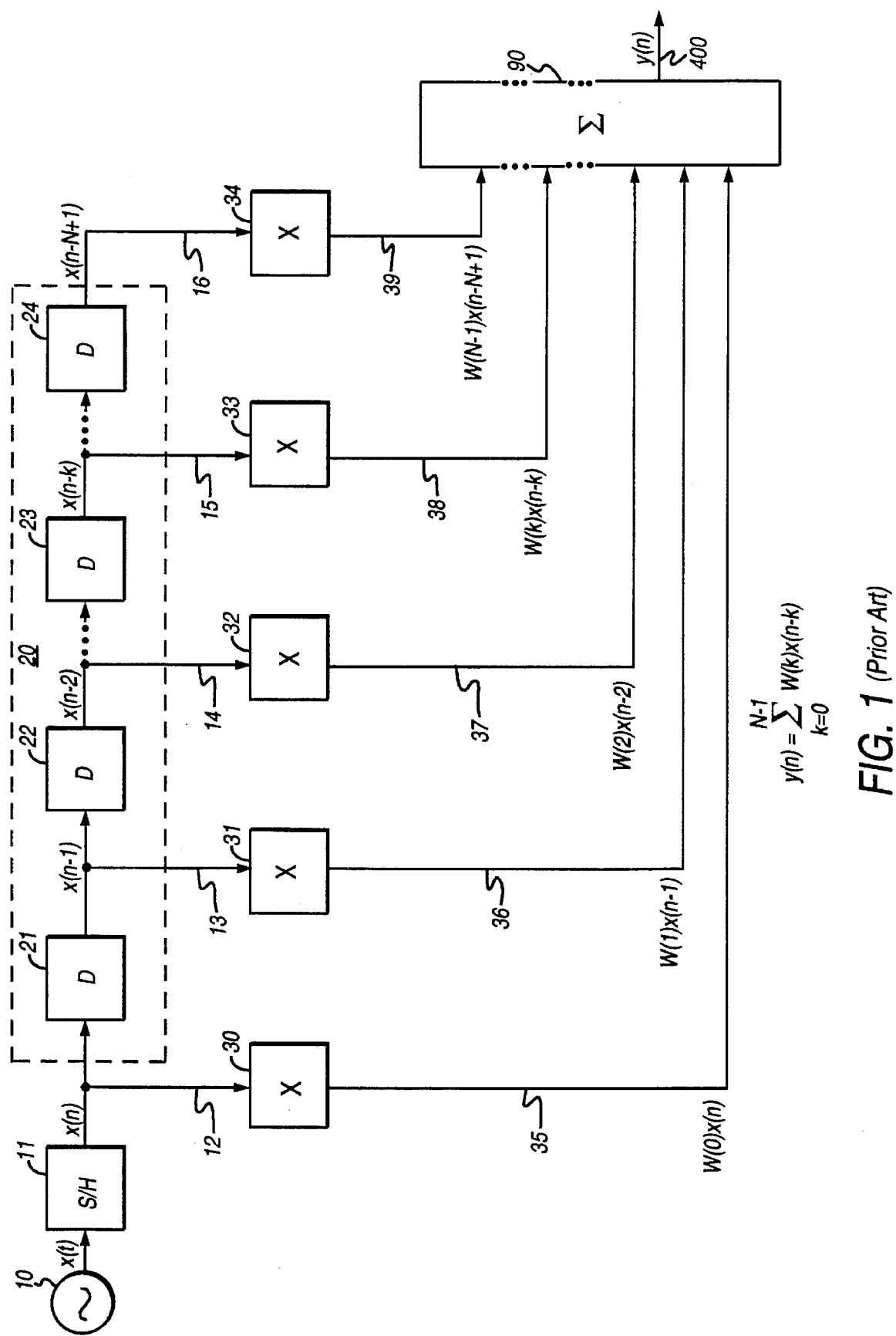
FIG. 1 is a block diagram of a conventional analog finite impulse response filter.

In the drawing, like reference numerals indicate like features, and a reference numeral appearing in more than one figure refers to the same element. The drawing and the following detailed description show a specific embodiment of the invention. Numerous specific details including capacitors, switches and shift registers are set forth in order to provides a more thorough understanding of the invention. However, it will be obvious to one skilled in the art that the present invention may be practiced without these specific details. Well known circuits have not been shown or described in detail so that the present invention is not obscured.

A basic form of an analog FIR filter is shown in FIG. 1 and is typical of prior art filters. The input to the filter is provided by analog input signal source 10. Input source 10 is connected to the input of sampling device 11. The sampling device output is connected to the input of delay line 20 which contains a desired number of delay elements. For illustration, FIG. 1 shows series-connected delay elements 21–24. Delay line 20 has a signal tap 12 at its input and additional taps 13–16 at the output of each delay element. Each of the signal taps 12–16 is connected to a multiplier circuit 30–34. The output lines 35–39 of the multipliers 30–34 are connected to the input terminals of summing circuit 90. The output of summing circuit 90 is the filter output signal line 400.

Figure 2:
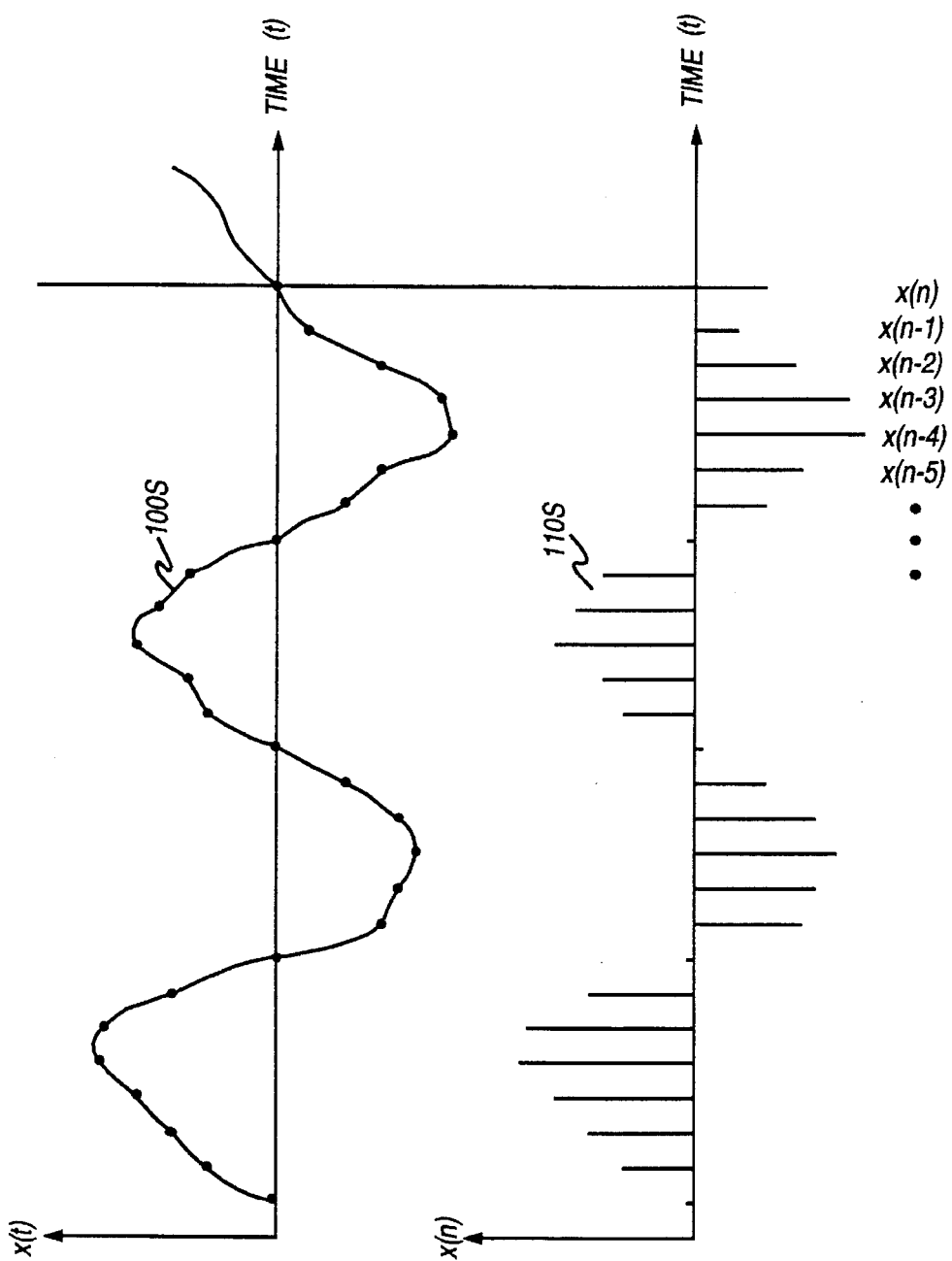
FIG. 2 is a diagram showing an analog signal and a sequence of discrete-time signals resulting from sampling the analog signal.

Referring to FIGS. 1 and 2, an analog input signal 100S, which is a continuous function of time x(t), is provided by signal source 10. Sampling device 11 samples the input signal 100S and produces a sequence 110S of discrete-time analog values x(n) which are input to delay line 20 containing N−1 delay elements. Signal taps 12–16 represent the total number N of signal paths through the filter. The index k, where 0≦k<N, will be used hereinafter to refer to the taps and their associated elements and signals. The signal x(n−k) from each tap is passed through its associated multiplier 30–34 where it is multiplied by a weighting factor W(k) contained in, or associated with, each multiplier. The product signals W(k)x(n−k) on lines 35–39, from each of the multipliers 30–34 are then added in summing circuit 90 and provided as a discrete-time output signal y(n) on line 400.

The filter of FIG. 1 implements the mathematical function:

$$y(n) = \sum_{k=0}^{N-1} W(k)x(n-k)$$

For example, if N=4, $$y(n)=W(0)x(n)+W(1)x(n-1)+W(2)x(n-2)+W(3)x(n-3).$$

And, if x(n−k)=0 for n−k<0, $$y(0)=W(0)x(0)$$

$$y(1)=W(0)x(1)+W(1)x(0)$$

$$y(2)=W(0)x(2)+W(1)x(1)+W(2)x(0)$$

$$y(3)=W(0)x(3)+W(1)x(2)+W(2)x(1)+W(3)x(0)$$

$$y(4)=W(0)x(4)+W(1)x(3)+W(2)x(2)+W(3)x(1)$$

$$y(5)=W(0)x(5)+W(1)x(4)+W(2)x(3)+W(3)x(2)$$

$$y(6)=W(0)x(6)+W(1)x(5)+W(2)x(4)+W(3)x(3)$$

$$y(7)=W(0)x(7)+W(1)x(6)+W(2)x(5)+W(3)x(4)$$

and the sequence continues indefinitely.

The first three lines in the above example, producing output values y(0), y(1), and y(2), illustrate the start of a sampling sequence when the delay line is being filled for the first time. The first valid output value is y(3) which occurs when all the terms are present. Likewise, at the end of a sampling sequence, the last three output values may be invalid as the delay line is flushed out.

The difficulty with the traditional FIR filter circuit shown in FIG. 1 is that the input signal is degraded by the delay process if analog means are used, e.g. delay lines or analog shift registers, or processing is slow and the hardware is expensive if digital means are used, e.g., analog to digital conversion and digital shift registers and multipliers.

Figure 3:
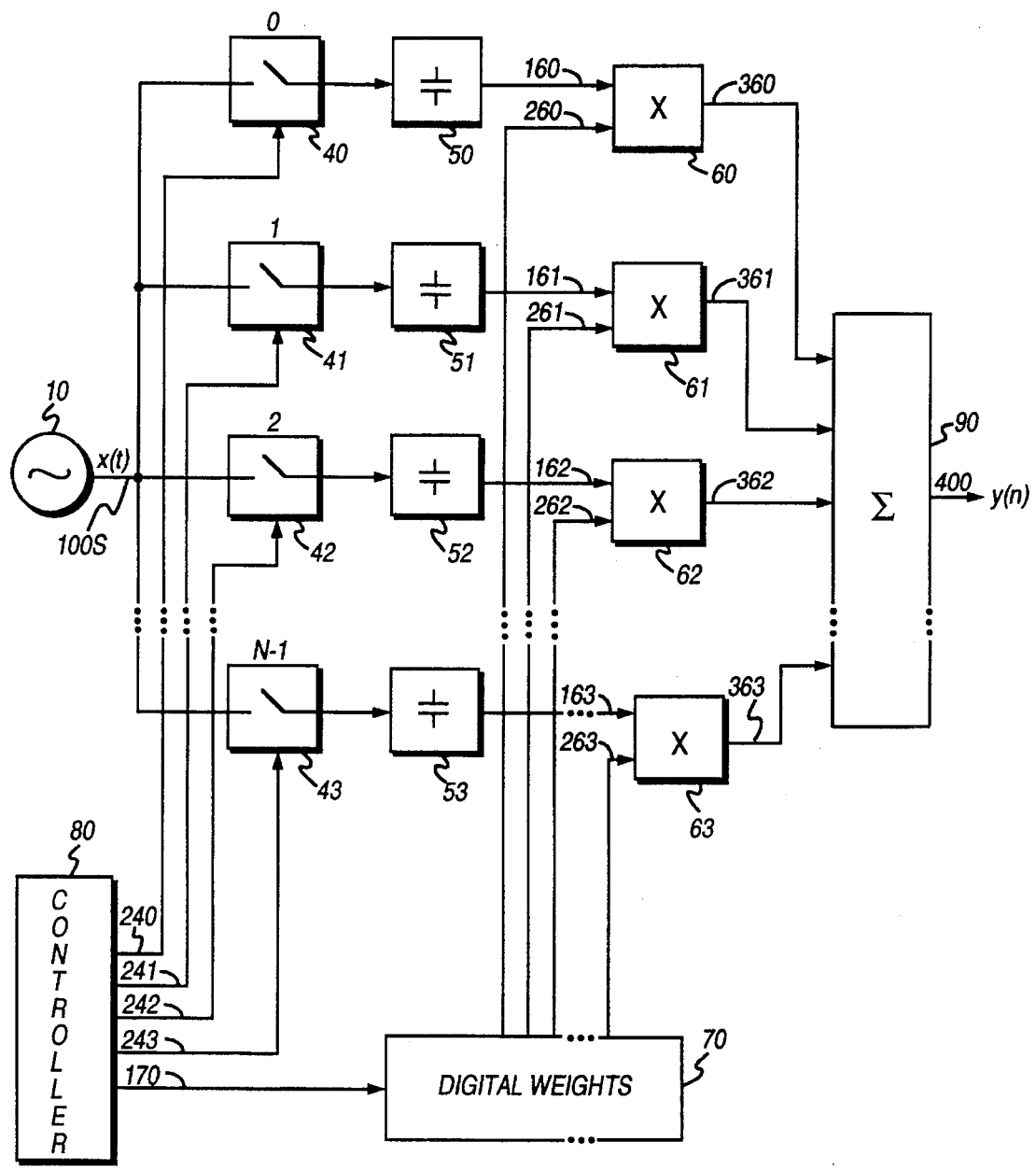
FIG. 3 is a block diagram of an FIR filter according to the present invention.

FIG. 3 is a block diagram of an FIR circuit that is constructed according to the present invention. The analog input signal source 10 is connected in parallel to N sampling devices 40–43. The output of sampling device 40 is connected to the input of hold (storage) device 50. The output of storage device 50 is connected by line 160 to the first multiplying (multiplicand) input of analog multiplier 60. The output (product) of multiplier 60 is connected by line 360 to an input of summing device 90. The output line 400 of summing device 90 carries the discrete-time output signal from the filter. In a similar manner, sampling devices 41–43 are connected to storage devices 51–53 and lines 161–163 connect storage devices 51–53 to multipliers 61–63. Multipliers 61–63 are connected to summing device 90 by lines 361–363. The second multiplying (multiplier) inputs of multipliers 60–63 are connected by lines 260–263 to the digital storage unit 70. Controller 80 is connected to sampling devices 40–43 by control lines 240–243 and to the digital storage unit 70 by control line 170.

Figure 4A:
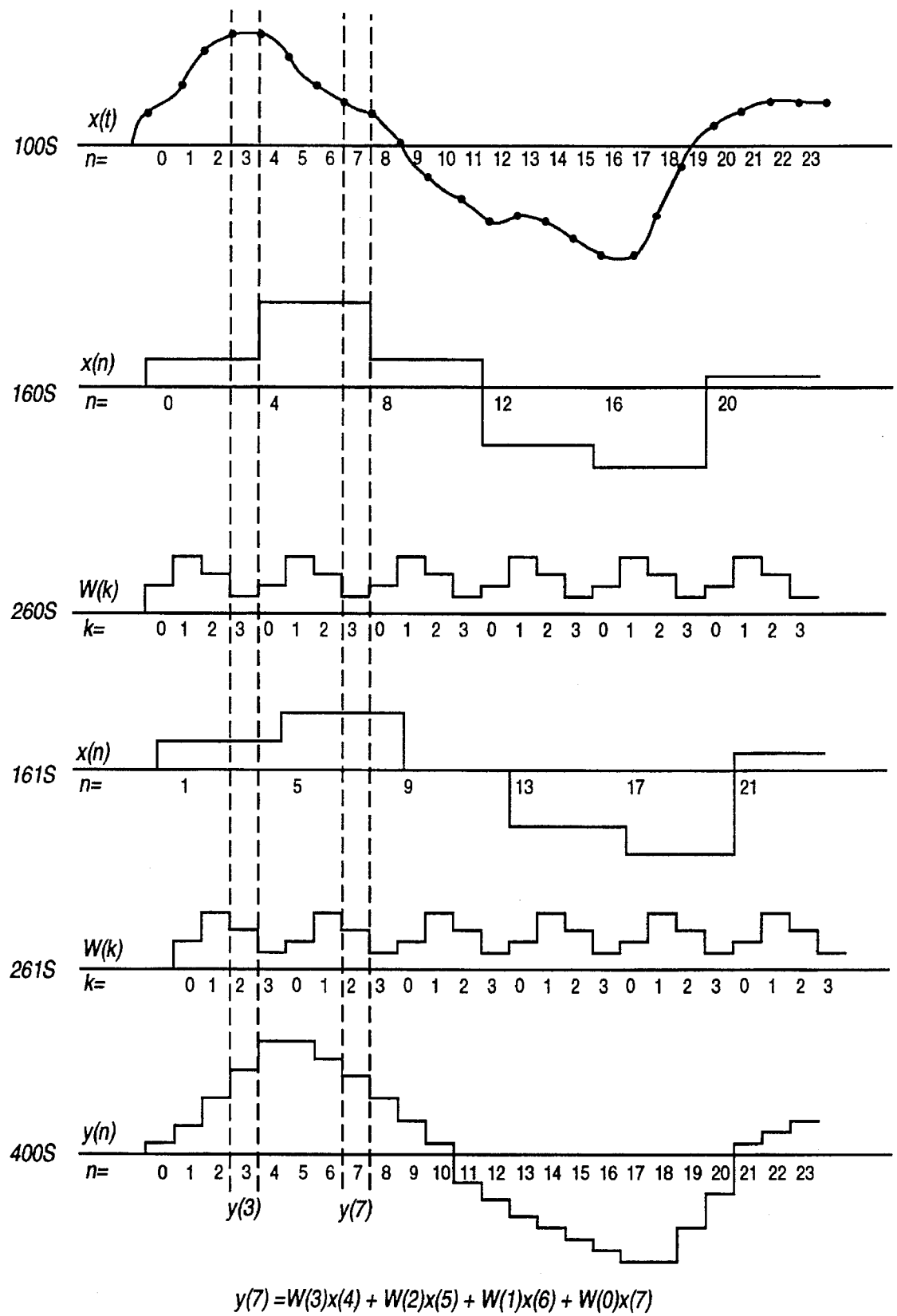
FIG. 4A is a signal diagram of a four-weight example of the filter of FIG. 3.
Figure 4B:
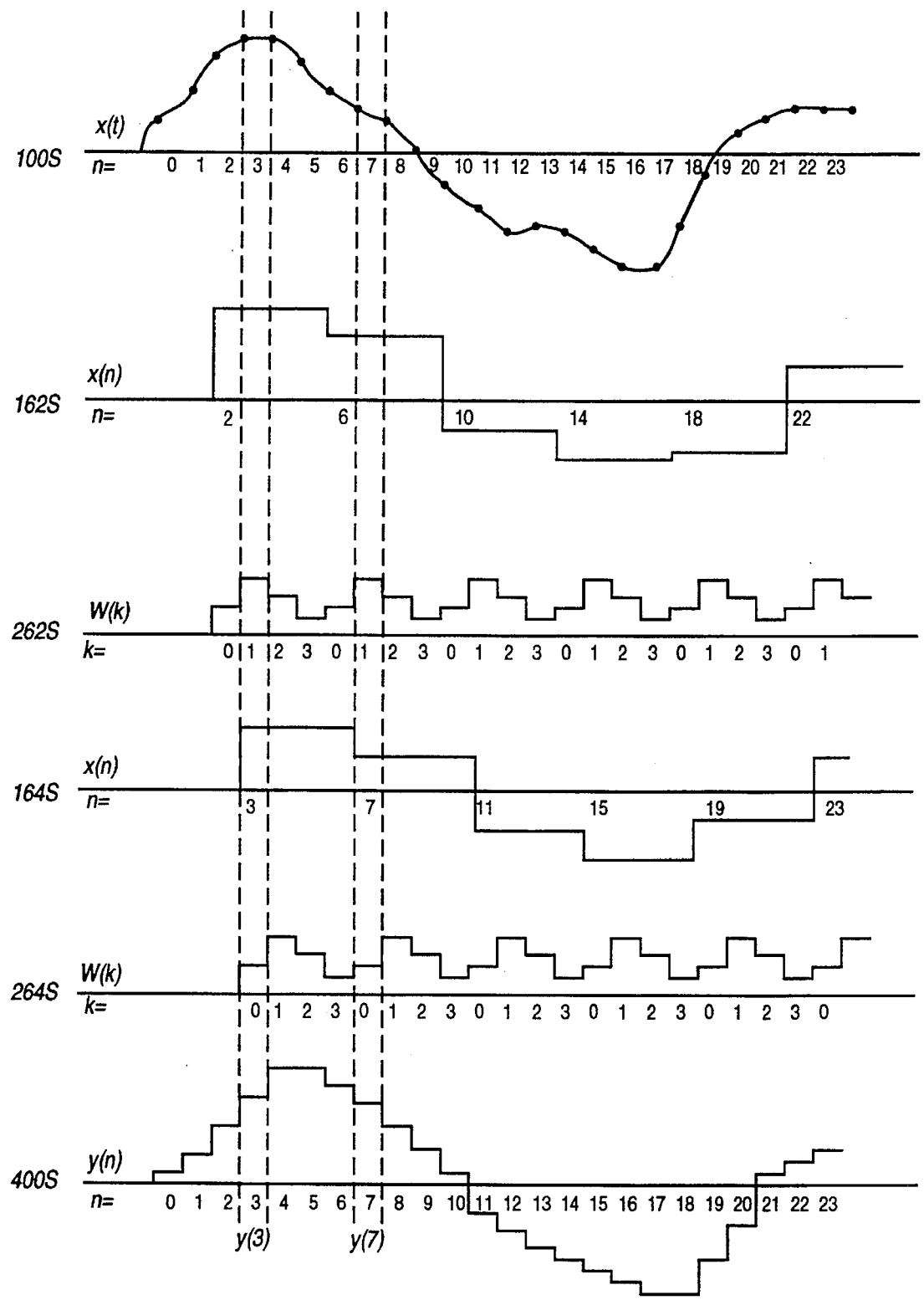
FIG. 4B is a continuation of FIG. 4A.

In operation, controller 80, which provides the sequencing function for the entire filter, repeatedly cycles through N logical states. Each state selects a different sampling device 40–43 and provides timing to the selected device for acquiring a sample and storing it in its associated storage device 50–53. Referring to FIG. 4A, the analog input signal 100S is periodically sampled at the times indicated by the dots on waveform 100S. Each dot represents one sample taken by one of the N sampling devices. Since a different sampling device is selected by each state, each sampling device is active in only one out of each N sample periods. For simplicity, in the following description, FIGS. 4A and 4B are used to show the case where N=4; both FIGS. 4A and 4B show the input signal 100S and output signal 400S for reference while FIG. 4A shows signals resulting from sampling devices 40 and 41 and FIG. 4B shows signals resulting from sampling devices 42 and 43. Sample values resulting from the action of sampling device 40 are stored in storage device 50 and are shown as signal 160S in FIG. 4A; signal 160S appears on line 160 in FIG. 3. Because each sampling device is active only once in N samples, the value of signal 160S stored in storage device 50 only changes once per four samples as shown in FIG. 4A. In a similar manner, the values of signals—161S–163S from sampling devices 41–43, stored in storage devices 51–53, also change once every four sample periods. Because each signal 160S–163S results from the selection of a different sampling device by controller 80, as it repeatedly cycles through N states, each signal changes at a different sample time.

Each state of the controller also selects, via control line 170, a different digital word in digital storage unit 70 to be supplied via line 260 to the second multiplier input of multiplier circuit 60. The signal on line 260, shown as signal 260S in FIG. 4, is the sequence of four weight values. The weight values change during each sample period (signal 260S) while the stored sample values change each four sample periods (signal 160S). In FIGS. 4A and 4B, the numbers below the signal baselines are either the index numbers of the weights (k) or of the sample values (n).

By performing a multiplication of signal 160S by signal 260S during each sample period, all four weights are used to multiply each sample value once each during every cycle of four states. Likewise, each of the other multiplier input lines 261–263 is connected to a different digital word selected by the state of controller 80. In general, with each change of state, controller 80 increments access for each multiplier input line 260–263 to the next higher-indexed digital weight; and, when the highest index (k=N−1) weight is accessed by a multiplier input, the next access is to the lowest (k=0) index weight. Multipliers 60–63 then multiply the sample values currently stored in storage devices 50–53 by the weighting values currently supplied by digital storage unit 70. The resulting product signals on lines 360–363 are then added by summing device 90 and supplied as the output signal 400S.

In short, each discrete-time output value y(n) is the product of a vector A, whose elements are the analog values stored in the sample storage devices 50–53, and a vector B, whose analog elements are equal to the digital values stored in the digital storage unit 70. In steady state operation, after the forming of each such product, the oldest element of A is replaced with a new sample and the elements of B are rotated one position.

The filter described for FIG. 3 implements the following mathematical function. This function is the same as that presented in the description for FIG. 1 except that the terms are rearranged as indicated below in the example equations.

$$y(n) = \sum_{k=0}^{N-1} W(k)x(n-k)$$

For example, if N=4, $$y(n)=W(0)x(n)+W(1)x(n-1)+W(2)x(n-2)+W(3)x(n-3).$$

Then, if x(n−k)=0 for n−k<0, after rearranging the terms, $$y(0)=W(0)x(0)$$

$$y(1)=W(1)x(0)+W(0)x(1)$$

$$y(2)=W(2)x(0)+W(1)x(1)+W(0)x(2)$$

$$y(3)=W(3)x(0)+W(2)x(1)+W(1)x(2)+W(0)x(3)$$

$$y(4)=W(0)x(4)+W(3)x(1)+W(2)x(2)+W(1)x(3)$$

$$y(5)=W(1)x(4)+W(0)x(5)+W(3)x(2)+W(2)x(3)$$

$$y(6)=W(2)x(4)+W(1)x(5)+W(0)x(6)+W(3)x(3)$$

$$y(7)=W(3)x(4)+W(2)x(5)+W(1)x(6)+W(0)x(7)$$

and the sequence continues indefinitely.

Figure 5:
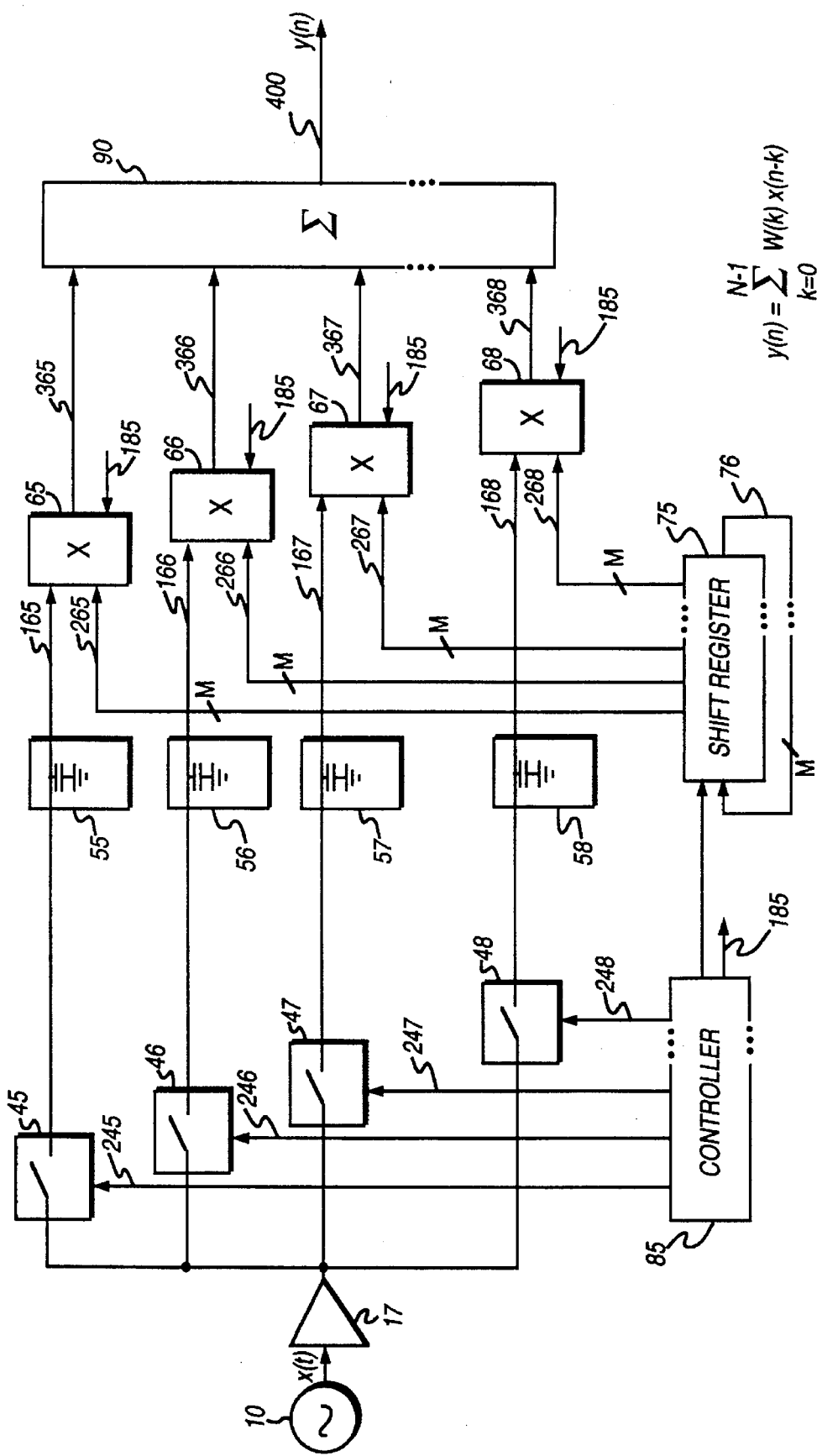
FIG. 5 is a schematic diagram of an embodiment of the FIR filter of FIG. 3.

FIG. 5 is a schematic diagram of an exemplary embodiment of the present invention. Analog signal source 10 is connected to buffer amplifier 17. The output of the buffer amplifier is connected in parallel to N analog switches 45–48. The output of analog switch 45 is connected by line 165 to storage capacitor 55 and to the first multiplying input of analog multiplier 65. Similarly, switches 46–48 are connected by lines 166–168 to capacitors 56–58 and to multipliers 66–68. The outputs of multipliers 65–68 are connected by lines 365–368 to summing device 90. The output signal line 400 of summing device 90 carries the discrete-time output signal of the filter. Line 265 connects multiplier 65 to one cell of an M by N bit shift register 75 where M is the number of bits (width) in the digital word in each cell and N is the number of cells (length) in the register. Shift register 75 has a recirculation path 76 connected from its data output to its data input. Input lines 266–268 of multipliers 66–68 are connected to the remaining cells in shift register 75. Controller 85 is connected to switches 45–48 by control lines 245–248, to shift register 75 by control line 175, and to multipliers 66–68 by line 185.

In operation, the analog input signal from source 10 is input to buffer amplifier 17 which provides isolation for input signal source 10 from the effects of the sampling process and provides sufficient power to charge the storage capacitors 55–58 without distortion of the input waveform. Analog switches 45–48, under timing control from controller 85, periodically connect the output of buffer amplifier 17 to sample storage capacitors 65–68. The sampling frequency is a function of the complexity of the input waveform and is often many times higher than the input frequency. During each sample period, one switch is closed for a time sufficiently long for its capacitor to charge to the instantaneous value of the input voltage but short relative to the rate of change of the input voltage. Each capacitor is thereby charged to the value of the input voltage during the time its switch is closed and retains that value until the next time its switch closes. The switches close one at a time in sequence until all N capacitors have been charged and then the cycle repeats indefinitely.

Each time the input signal from source 10 is sampled, the digital weights in the shift register 75, under timing control from controller 85, advance one position; and, as the word in the last cell of the register is shifted out, it is shifted into the first cell via the recirculation path 76. In this way, with each sample of the input signal, the digital words (weights) rotate one cell position. The digital words are supplied to the digital multiplying inputs of multipliers 65–68 and loaded into the multipliers by the clock signal on line 185. The analog multiplying inputs of multipliers 65–68 are supplied with sample values from storage capacitors 55–58. During each sample period, multipliers 65–68 multiply all N sampled values currently stored in capacitors 55–58 by the weights currently presented by their respective cells in shift register 75. The resulting discrete-time analog outputs (products) from multipliers 65–68 are added by summing device 90 and provided as the filter output signal y(n) on line 400.

The signals in the operation of FIG. 5 are the same as in FIGS. 4A and 4B. The following equations describe the results of the operation more concisely:

$V_{C1} = V_{IN}(0)$   $V_{OUT}(0) = W(0)V_{C1} + W(3)V_{C2} +$
$\qquad\qquad\qquad W(2)V_{C3} + W(1)V_{C4}$
$\qquad\qquad\quad = W(0)V_{IN}(0)$ $V_{C2} = V_{IN}(1)$   $V_{OUT}(1) = W(1)V_{C1} + W(0)V_{C2} +$
$\qquad\qquad\qquad W(3)V_{C3} + W(2)V_{C4}$
$\qquad\qquad\quad = W(1)V_{IN}(0) + W(0)V_{IN}(1)$ $V_{C3} = V_{IN}(2)$   $V_{OUT}(2) = W(2)V_{C1} + W(1)V_{C2} +$
$\qquad\qquad\qquad W(0)V_{C3} + W(3)V_{C4}$
$\qquad\qquad\quad = W(2)V_{IN}(0) + W(1)V_{IN}(1) +$
$\qquad\qquad\qquad W(0)V_{IN}(2)$ -continued $V_{C4} = V_{IN}(3)$   $V_{OUT}(3) = W(3)V_{C1} + W(2)V_{C2} +$
$\qquad\qquad\qquad W(1)V_{C3} + W(0)V_{C4}$
$\qquad\qquad\quad = W(3)V_{IN}(0) + W(2)V_{IN}(1) +$
$\qquad\qquad\qquad W(1)V_{IN}(2) + W(0)V_{IN}(3)$ $V_{C1} = V_{IN}(4)$   $V_{OUT}(4) = W(0)V_{C1} + W(3)V_{C2} +$
$\qquad\qquad\qquad W(2)V_{C3} + W(1)V_{C4}$
$\qquad\qquad\quad = W(0)V_{IN}(4) + W(3)V_{IN}(1) +$
$\qquad\qquad\qquad W(2)V_{IN}(2) + W(1)V_{IN}(3)$ $V_{C2} = V_{IN}(5)$   $V_{OUT}(5) = W(1)V_{C1} + W(0)V_{C2} +$
$\qquad\qquad\qquad W(3)V_{C3} + W(2)V_{C4}$
$\qquad\qquad\quad = W(1)V_{IN}(4) + W(0)V_{IN}(5) +$
$\qquad\qquad\qquad W(3)V_{IN}(2) + W(2)V_{IN}(3)$ $V_{C3} = V_{IN}(6)$   $V_{OUT}(6) = W(2)V_{C1} + W(1)V_{C2} +$
$\qquad\qquad\qquad W(0)V_{C3} + W(3)V_{C4}$
$\qquad\qquad\quad = W(2)V_{IN}(4) + W(1)V_{IN}(5) +$
$\qquad\qquad\qquad W(0)V_{IN}(6) + W(3)V_{IN}(3)$ $V_{C4} = V_{IN}(7)$   $V_{OUT}(7) = W(3)V_{C1} + W(2)V_{C2} +$
$\qquad\qquad\qquad W(1)V_{C3} + W(0)V_{C4}$
$\qquad\qquad\quad = W(3)V_{IN}(4) + W(2)V_{IN}(5) +$
$\qquad\qquad\qquad W(1)V_{IN}(6) + W(0)V_{IN}(7)$ As can be seen by comparing the preceding equations with those presented in the descriptions of FIG. 1 and FIG. 2, the functions are equivalent. However, by shifting the digital values instead of the analog values, there is no degradation in signal quality due to analog delay processes. Also, since there is no need for analog-to-digital conversion of the input signal, or digital multiplication, the process can be much faster and require less circuitry for processing.

Figure 6:
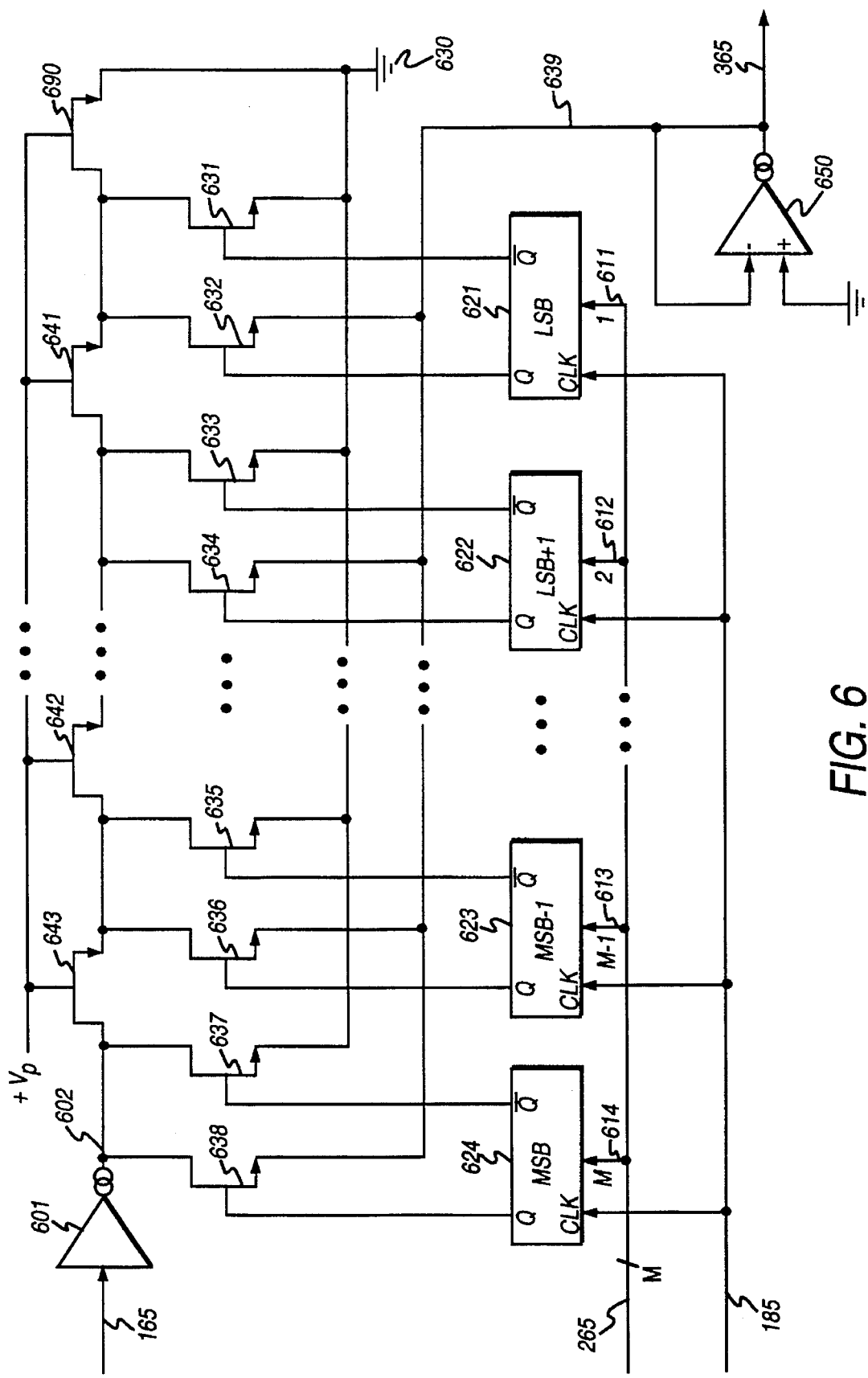
FIG. 6 is a schematic diagram of one embodiment of a multiplier circuit used in FIG. 5.
Figure 7A:
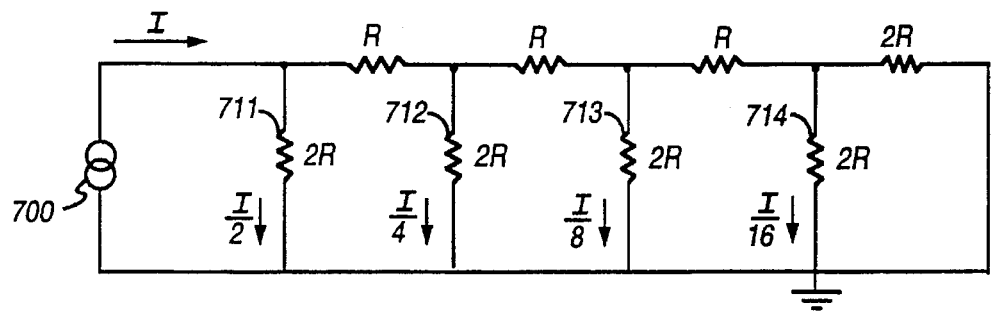
FIGS. 7A, 7B and 7C are utilized to explain the principles of separation of the multiplier circuit of FIG. 6.

FIG. 6 is a schematic diagram of an embodiment of the multiplier circuit 65 used in FIG. 5. Similar circuits are used in multiplier circuits 66–68. The multiplier circuit of FIG. 6 utilizes a binary current divider network shown in FIG. 7A commonly referred to as an R/2R ladder network. In FIG. 7A, a current I is supplied to the network by current source 700. The R/2R network topology produces a current in branch 711 which is one-half of the input current supplied by current source 700. The current produced in branch 712 is one-half the current produced in branch 711. Likewise, the current in branch 713 is one-half the current in branch 712, and so on to the end of the network. FIG. 7A shows an example having only four such branches; however, the network can be extended indefinitely—limited in the practical case by the tolerances of the components.

Figure 7B:
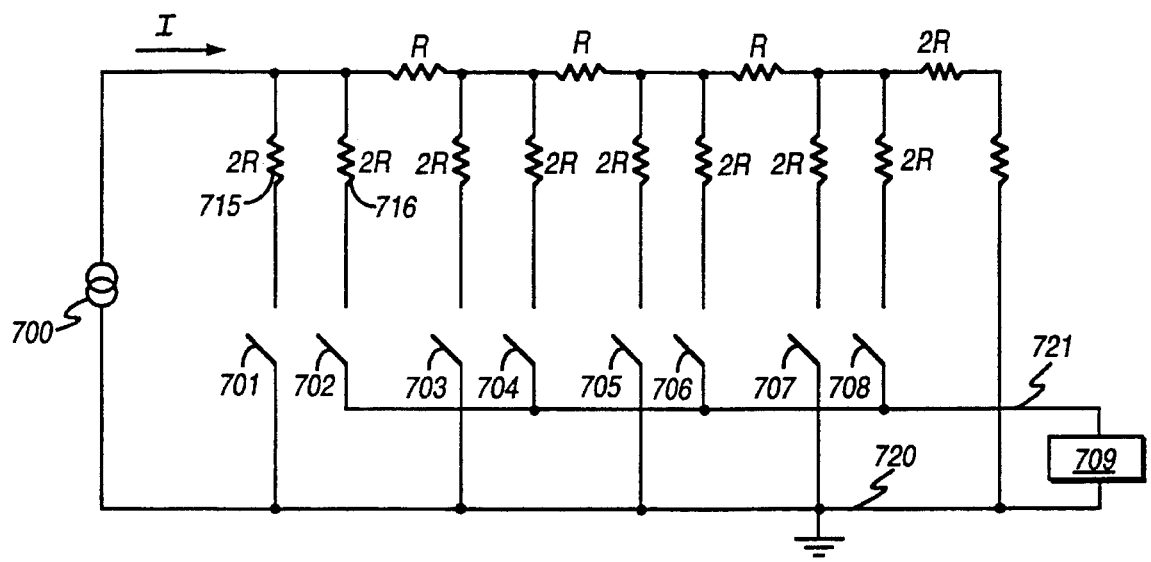

FIG. 7B shows a modification of the network of FIG. 7A wherein branch 711 is replaced by branches 715 and 716. Switch 701 connects branch 715 to ground line 720. Switch 702 connects branch 716 to collector line 721 which is connected to output load 709. In operation, either switch 701 or switch 702, but not both, can be closed at one time. The output load 709 is designed to have an input impedance sufficiently low to ensure that the voltage across it has a negligible effect on the operation of the ladder network. Since only switch 701 or 702 can be closed at one time, and since the collector line 721 is a virtual ground due to the low impedance of output load 709, the current division function is the same as described for FIG. 7A. However, switches 701 and 702 can now steer what was the current in branch 711 of FIG. 7A to either the output load 709 or to the ground line 720. Similarly, switches 703–708 can steer their currents to either load 709 or ground 720.

In the circuit of FIG. 7B, the current supplied to output load 709 can be any integral number, between 0 and 15, of sixteenths of the current supplied by source 700. Although, to simplify its explanation, the circuit of FIG. 7B has only four active branches, and therefore 16 binary states, the number of states can be doubled for each additional branch added to the network.

Figure 7C:
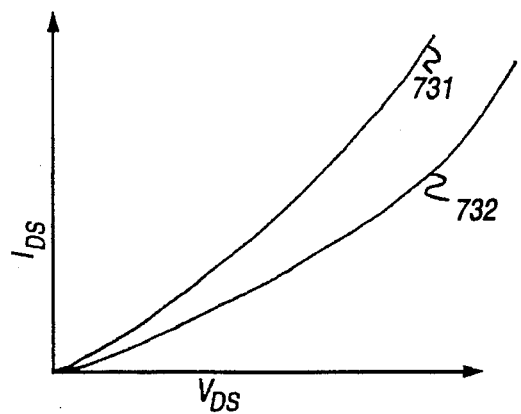

The circuit of FIG. 6 incorporates the R/2R ladder concept of FIG. 7B wherein the resistors and switches are replaced by field-effect transistors (FET) operating in the triode region. FIG. 7C shows the drain-source current and drain-source voltage relationship of an FET operating with a constant gate voltage. The approximately linear current-voltage relationship can be a good representation of a resistor over a small incremental range of voltage or current. The conductivity of an FET is approximately proportional to its gate width if all other parameters are the same. As shown in FIG. 7C, curve 731 represents the characteristic of a transistor with a gate width which is double that of the transistor whose characteristic is represented by curve 732. Utilizing these properties of FETs, resistors having values of R and 2R can be replaced by transistors which are identical except for having gates with relative widths 2W and W, respectively.

Referring back to FIG. 6, the analog "multiplicand" input signal on line 165 is the discrete-time analog voltage signal stored on capacitor 55 in FIG. 5. Input line 165 is connected to transconductance amplifier 601. The output line 602 from amplifier 601 is connected to the drain terminals of transistors 637, 638, and 643. The source terminal of transistor 643 is connected to the drain terminals of transistors 635, 636, and 642. The connection pattern just described is repeated for the subsequent stages in the multiplier circuit up to the final transistor 640 whose source terminal is connected to ground line 630. Although the multiplier circuit shown in FIG. 6 shows only four stages for simplicity of explanation, in the general case the actual number of stages M is determined by the resolution requirements of the FIR filter. The gate terminals of transistors 640–643 are connected to a voltage source Vp (not shown). The source terminals of transistors 631, 633, 635, and 637 are connected via collector line 639 to multiplier circuit "product" output signal line 365. The source terminals of transistors 632, 634, 636, and 638 are connected to ground.

The gate terminals of transistors 632, 634, 636, and 638 are connected to the true (1) output terminals of latches 621–624. The gate terminals of transistors 631, 633, 635, and 637 are connected to the false (0) terminals of latches 621–624. The input terminals of latches 621–624 are connected to the individual bit lines in the M-bit digital "multiplier" input line 265 from one of the digital word cells in shift register 75 shown in FIG. 5. Clock inputs to the latches 621–624 are provided via line 185 by controller 85 also shown in FIG. 5. The negative (inverting) input and the output terminals of transconductance amplifier 650 are connected to product output line 365. The positive (non-inverting) input terminal of amplifier 650 is connected to ground.

In operation, transconductance amplifier 601 converts the voltage signal on line 165 to a current signal in line 602. Transistor 643 functions as the first series-resistor, of value R, in FIG. 7B. Transistors 638 and 637 provide two functions: first, as the resistors, of value 2R, in branches 715 and 716, and second, as switches 701 and 702 in FIG. 7B. If the bit stored in latch 624 is true (1), the latch output voltage supplied to the gate terminal of transistor 638 is equal to Vp and the transistor performs as a resistor of value 2R connected between line 602 and line 365. Meanwhile, the latch output voltage supplied to gate terminal of transistor 637 is equal to zero and the transistor acts as an open switch. In this way, one-half of the current in line 602 is supplied to collector line 639. Conversely, if the bit stored in latch 624 is false (0), the output voltage of latch 624, supplied to the gate terminal of transistor 637, is equal to Vp and transistor 637 performs as a resistor of value 2R connected between line 602 and ground. Meanwhile, the output voltage of latch 624, supplied to the gate terminal of transistor 638, is equal to zero and the transistor acts as an open switch. Thereby, in this case, one-half the current in line 602 is diverted to ground and the current supplied to collector line 639 from this stage is equal to zero.

Transconductance amplifier 650 acts as a low-impedance (virtual ground) load for transistors 632, 634, 636, and 638 while passing the output "product" signal current over line 365 to summing circuit 90 shown in FIG. 5.

Since amplifier 650 provides a virtual ground for collector line 639, and since transistors 637 and 638 have nearly identical characteristics, the current division performance of the ladder network is the same regardless of whether transistor 637 or transistor 638 is turned on; the same current value is steered to either ground or to the output line.

In a similar manner, subsequent stages steer their corresponding portions of the current in line 602 to the output line 365.

The multiplier circuit produces an output current signal on line 365 which is equal to the product of two terms: first, the input voltage on line 165 multiplied by a factor equal to the conversion factor of amplifier 601, and second, the fraction composed of the binary value of the M-bit digital word on line 265 and the value $2^M$ where M is also the number of stages, or rungs, in the ladder network.

Figure 8A:
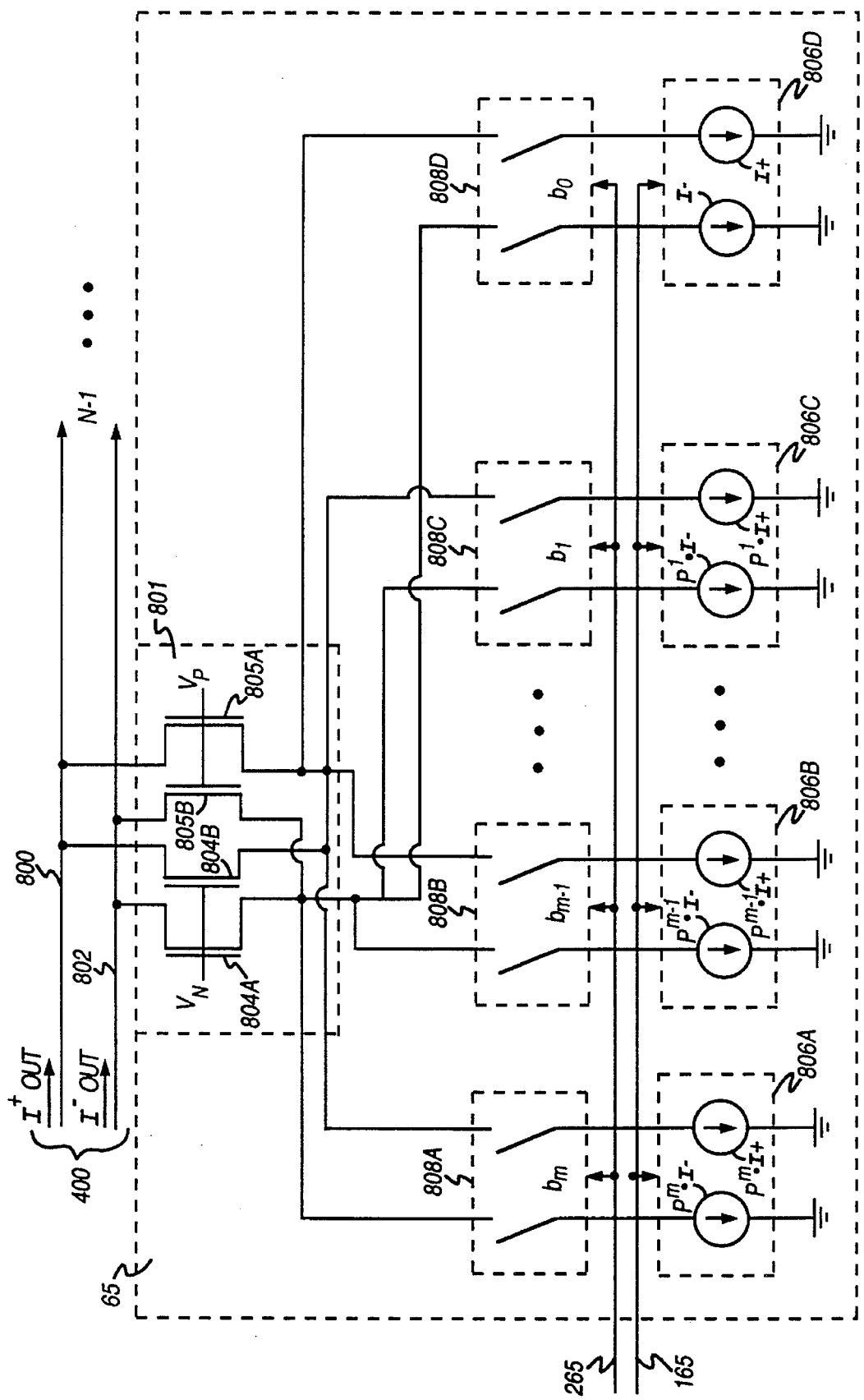
FIGS. 8A, 8B, and 8C show an alternative embodiment of a multiplier circuit used in FIG. 5.
Figure 8B:
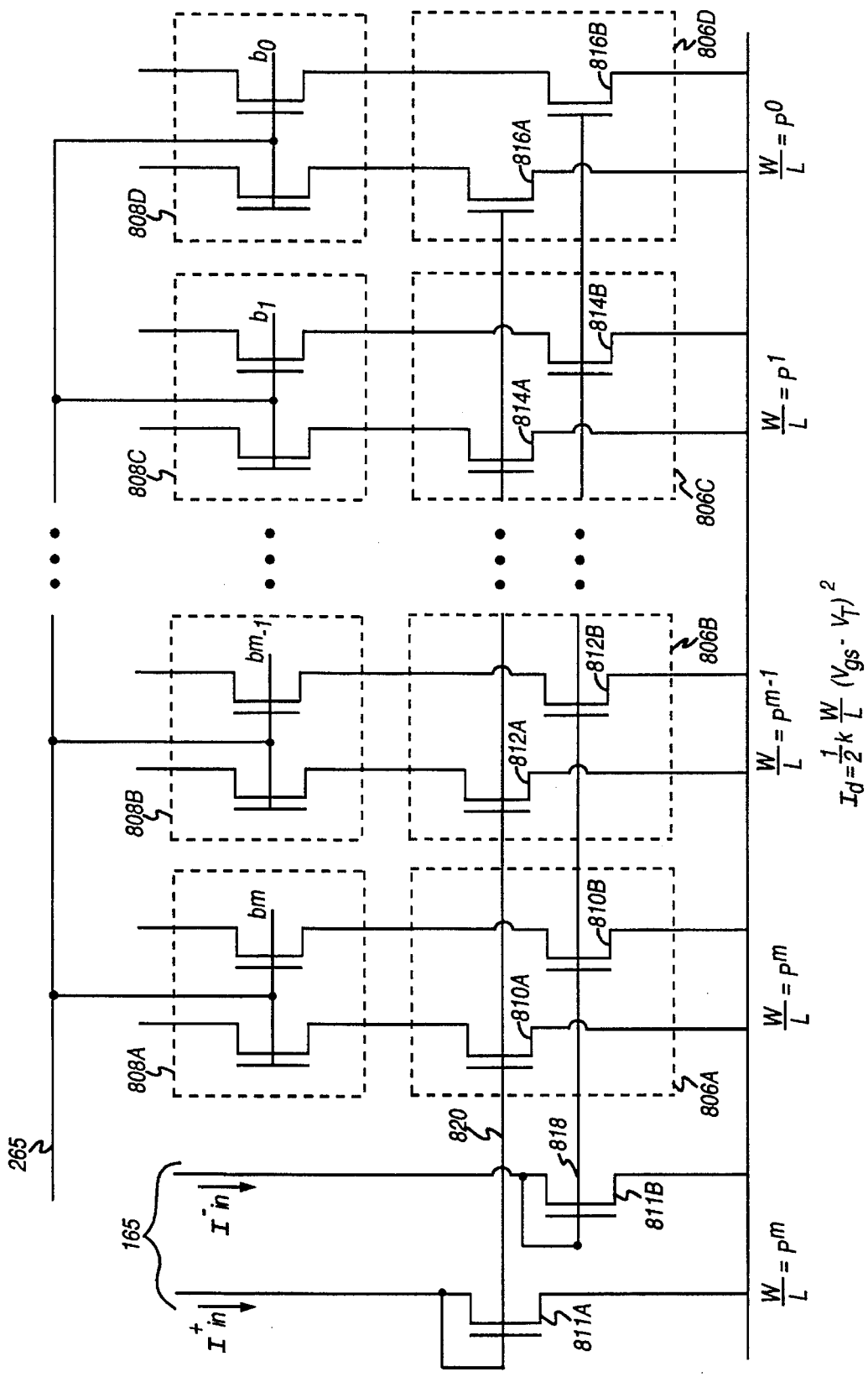
Figure 8C:
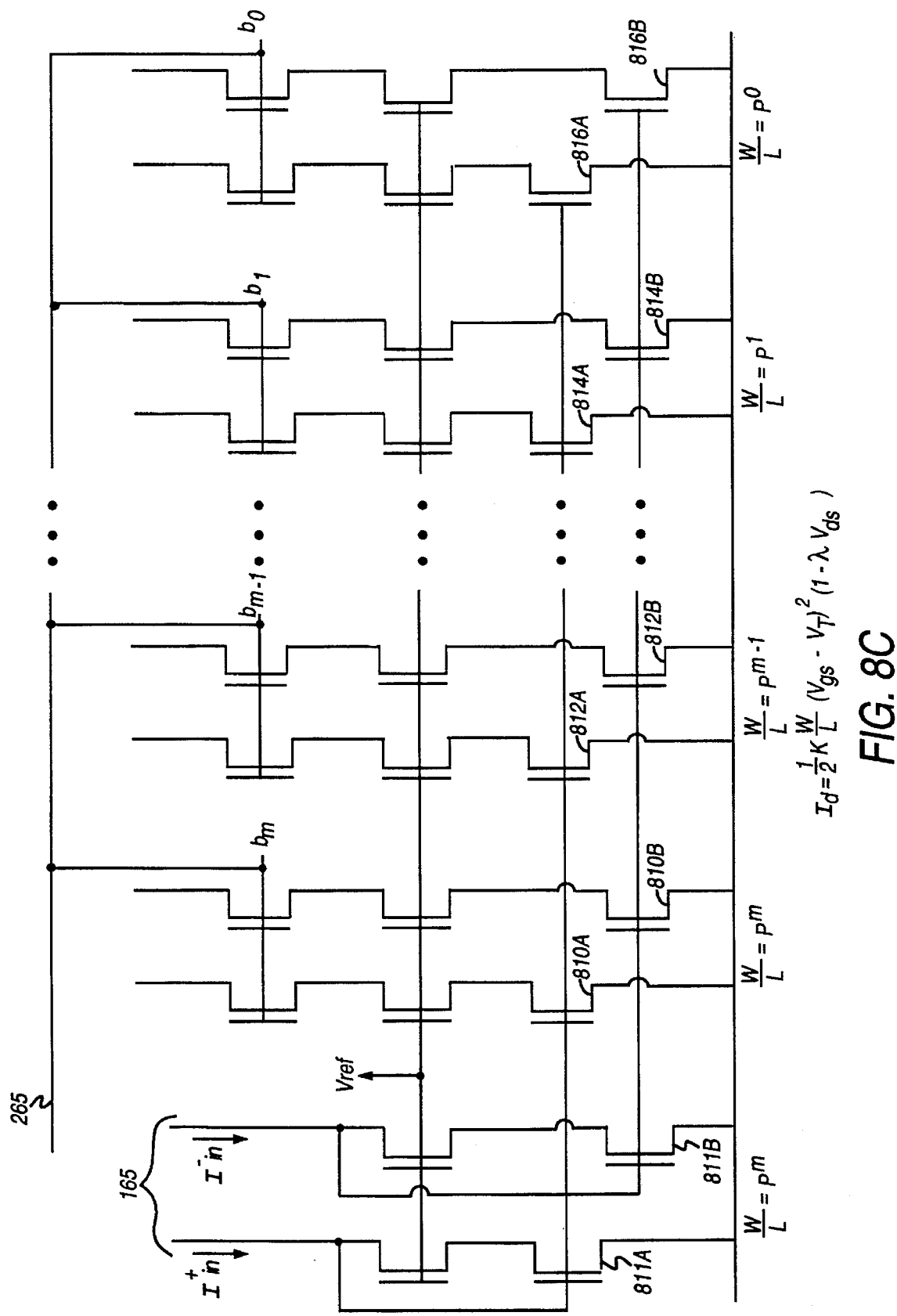

An alternative embodiment for the Nth multiplier circuit 65 of FIG. 5 is shown in FIGS. 8A–8C. Similar circuits are used for the multiplier circuits 66–68 of FIG. 5. For this embodiment, the analog sample values and the analog output signal are differential signals. As in the embodiment of FIG. 6, the output of the multiplier shown in FIG. 8A is a current. The output currents from each multiplier are connected (summed) to form an analog output current 400 for the filter.

The output current from the multiplier of FIG. 8A is connected to leads 800 and 802 to form a differential output current I$^+$out and I$^-$out, respectively. The output currents from multipliers 66–68 are similarly connected to leads 800 and 802 resulting in a summed current output signal 400. A differential switch 801, comprised of transistors 804A, 804B, 805A, and 805B, connects the output of multiplier 65 to leads 800 and 802. The differential switch 801 has a differential input signal VP–VN that determines the sign of the multiplication as described bellow.

An M number of digital weight differential current sources 806A–806D generate a respective current value $P^j * I^+$ and $P^j * I^-$ for each bit of the M-bit digital weight values W(k) where $0 \leq j < M$ and P is the base of the digital weight value (e.g., P=2 for binary weights). Each current source 806A–806D generates the respective M-bit current proportional to $P^j * x(Ai)$ where x(Ai) is one of the analog input sample values applied over line 165. A bank of switches 808A–808D connects each of the M-bit current sources 806A–806D to the differential switch 801. A digital value (bm,bm–1, . . . ,b1,b0) of an associated digital filter weight W(k) is applied to the switches 808A–808D over line 265 thereby applying a current to the differential switch 801 proportional to the multiplication of the analog sample value x(Ai) by the digital weight value W(k).

The sign of the digital weight value W(k) is applied as the differential input VP–VN to the differential switch 801. If the sign of the digital weight W(k) is positive, then the differential input VP–VN is positive turning on transistors 804A and 804B, thereby connecting (and adding) the current source output currents $P^j*I^+$ to $I^+$out and the current source output currents $P^j*I^-$ to $I^-$out through the switches 808A–808D that are turned on by the digital weight W(k). If the sign of the digital weight W(k) is negative, then the differential input VP–VN is negative turning on transistors 805A and 805B, thereby connecting (and adding) the current source output currents $P^j*I^-$ to $I^+$out and the current source output currents $P^j*I^+$ to $I^-$out through the switches 808A–808D that are turned on by the digital weight W(k).

An implementation of the M current sources 806A–806B and switches 808A–808D of FIG. 8A is shown in FIG. 8B. Current source 806A is a differential current mirror circuit comprising transistors 810A and 810B. The gate of transistor 810A is connected to the gate of transistor 811A over line 820, and the gate of transistor 810B is connected to the gate of 811B over line 818. Therefore, the drain currents in transistors 810A and 810B are proportional to the respective drain currents in 811A and 811B. The input drain currents $I^+$in and $I^-$ in transistors 811A and 811B are proportional to an analog input sample value Ai at line 165. Current sources 806B–806D are implemented using similar current mirror circuits.

The drain current Id of the transistors in the current mirror circuits can be approximated by the well known equation:

$$Id=(½)K(W/L)(Vgs-Vt)^2.$$

In the above drain current equation, Id is proportional to the ratio of the width/length (W/L) of the transistor. By varying the (W/L) ratio, the drain current in the current mirror circuits are digitally weighted. That is, the (W/L) ratio of the transistors in the current mirror circuits is adjusted such that (W/L)=$P^j$. (Again, P is the base of the digital weight and $0 \leq J < M$ where M is the number of bits in the digital weight.) The (W/L) ratios for the respective current mirror circuits are shown in FIG. 8B (e.g., (W/L)=$P^m$ for transistors 810A and 810B, and (W/L)=$P^{m-1}$ for transistors 812A and 812B.) Switches 808A–808D comprise a simple transistor switch with the gate of each connected to a respective bit bj of a digital weight value W(k).

A closer approximation of the drain current Id of a transistor is given by the well known equation:

$$Id=(½)K(W/L)(Vgs-Vt)^2(1-AVds).$$

As shown in FIG. 8C, a cascode configuration is used to implement the current mirror circuits to keep the drain to source voltage Vds of transistors 810A–816A and 810B–816B at the same level, thereby increasing the accuracy of the current sources.

FIGS. 9A–9J illustrate how setting a predetermined consecutive number of the digital weight values to zero increases the setup time, and thereby the precision, of the analog multiplying circuits. In these figures, the analog input samples are stored in the analog storage devices 900 over line 902. The digital weight values are stored in a digital ring shift register 904 wherein the output is connected to the input so that the weights are shifted in a circular manner as shown. The analog input samples and the digital weight values are applied to respective multipliers, the outputs of which are applied to the analog summing circuit 90 to generate the analog output signal at line 400. For the example illustrated, there are ten total filter weights. The first 0–4 filter weights are set to zero, and the last 5–9 filter weights are the actual weight values W0–W4 for the filter.

The operation of the filter with respect to the setup times of the multipliers is understood with a sequential reference to FIGS. 9A–9J.

Figure 9A:
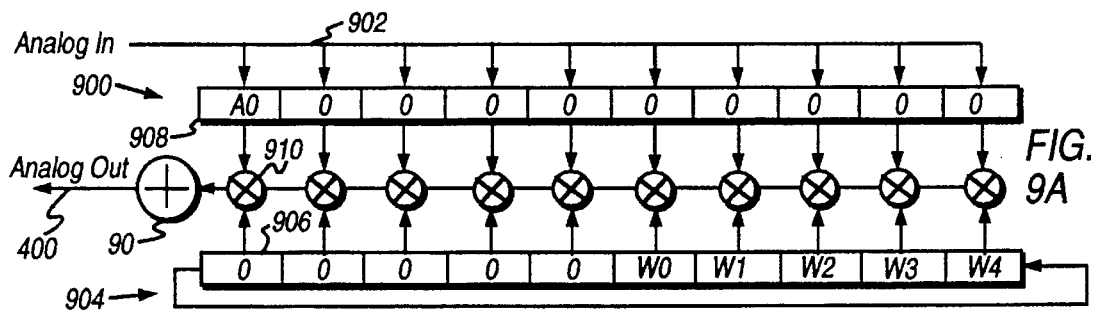
FIGS. 9A–9J illustrate how setting a predetermined number of the digital weight values to zero increases the setup time, and thereby the precision, of the analog multiplying circuits.

Starting with FIG. 9A, the analog storage devices are initialized to zero, the digital ring shift register is loaded with the digital weight values, and the first analog input sample A0 is stored at analog storage device 908. The analog input sample A0 is applied to multiplier 910, and the setup time for multiplier 910 begins. Rather than delay the multiplication, however, it occurs immediately. Since the digital weight value at 906 is zero, the output of multiplier 910 is also zero and has no affect on the analog output signal 400.

Figure 9B:
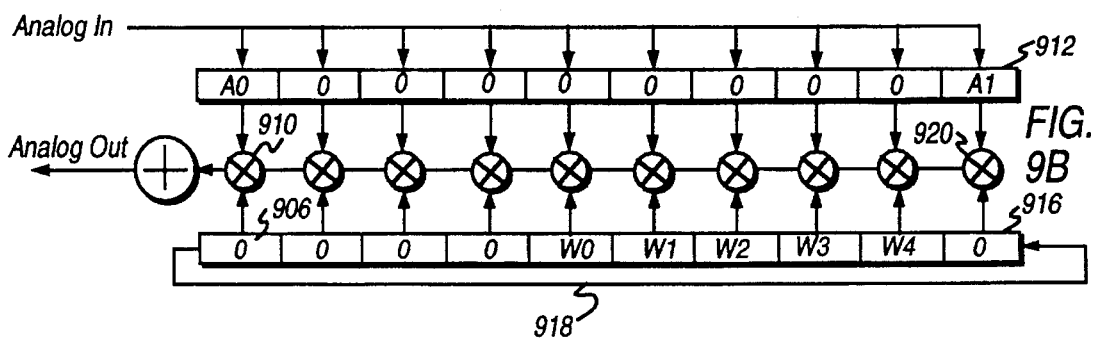
Figure 9C:
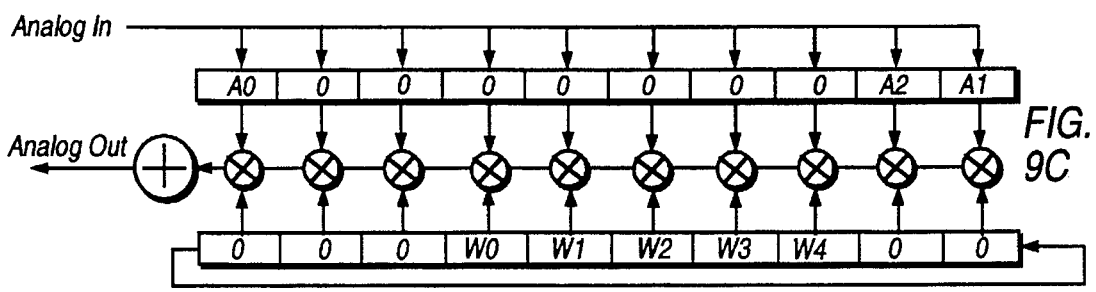
Figure 9D:
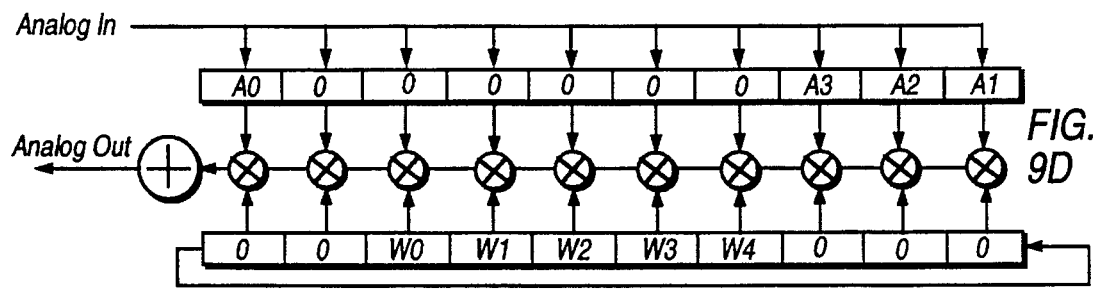
Figure 9E:
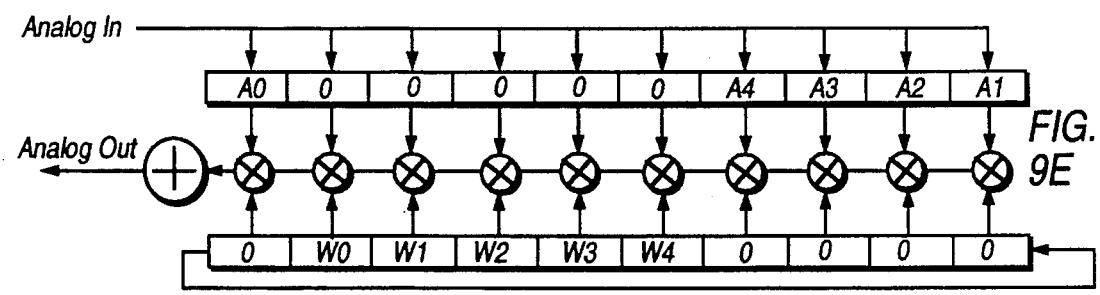

Continuing now to FIG. 9B, at the next clock cycle the next analog input sample A1 is stored in analog storage device 912, and the digital weights stored in the digital ring shift register 904 are shifted to the left by one. The digital weight at 906 is transferred to storage device 916 over line 918. The analog input sample A1 is applied to multiplier 920, and the setup time for multiplier 920 begins. Again, since the digital weight value at 916 is zero, the output of multiplier 920 is also zero and has no affect on the analog output signal 400. The setup time for multiplier 910 continues since the digital weight at 914 is also zero.

Figure 9F:
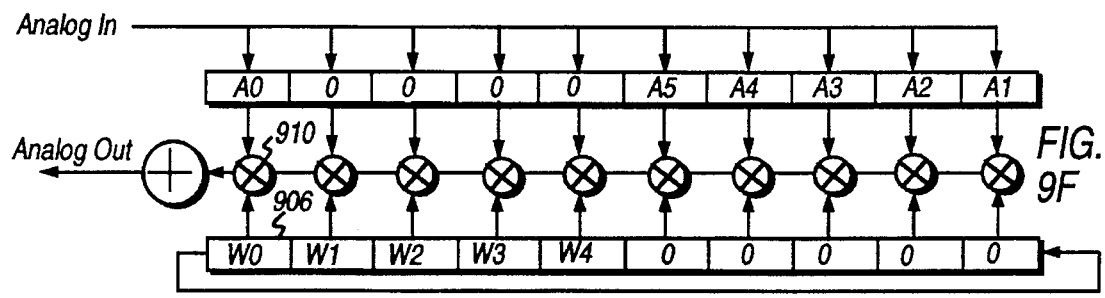
Figure 9G:
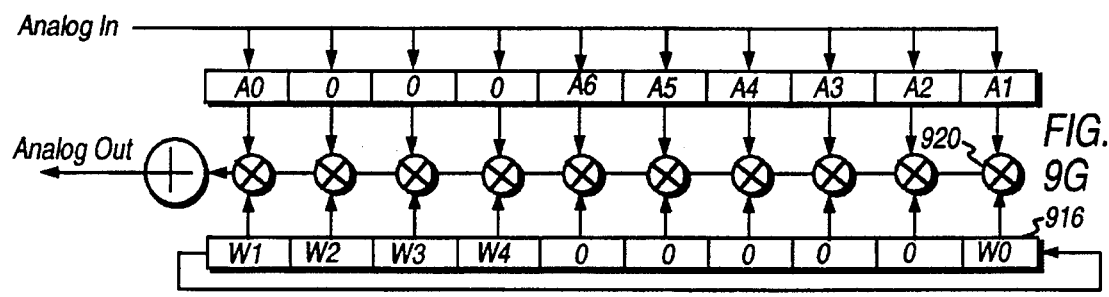
Figure 9H:
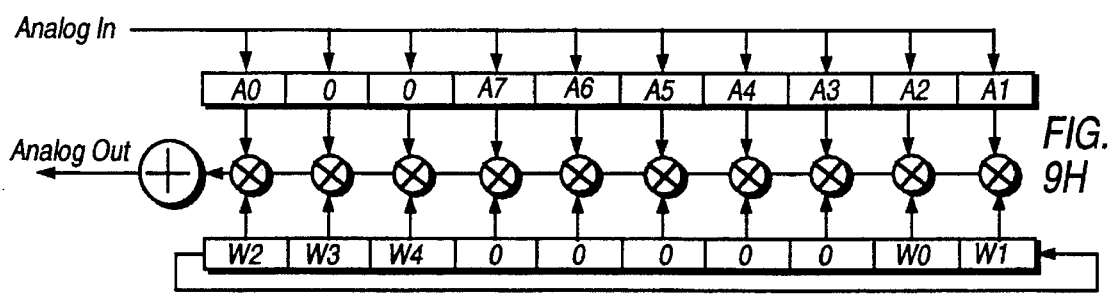
Figure 9I:
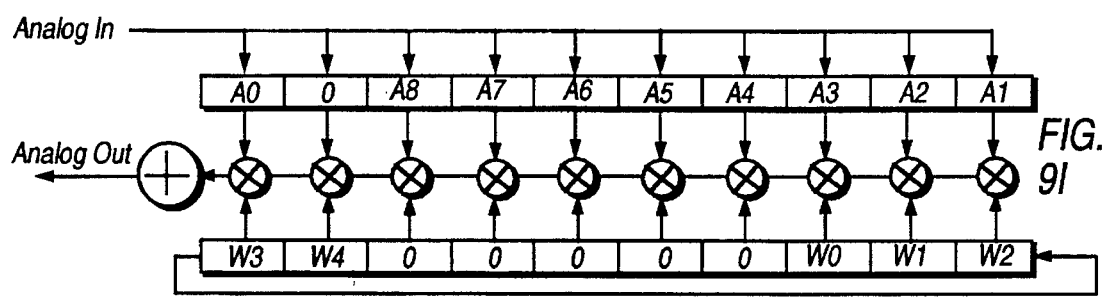
Figure 9J:
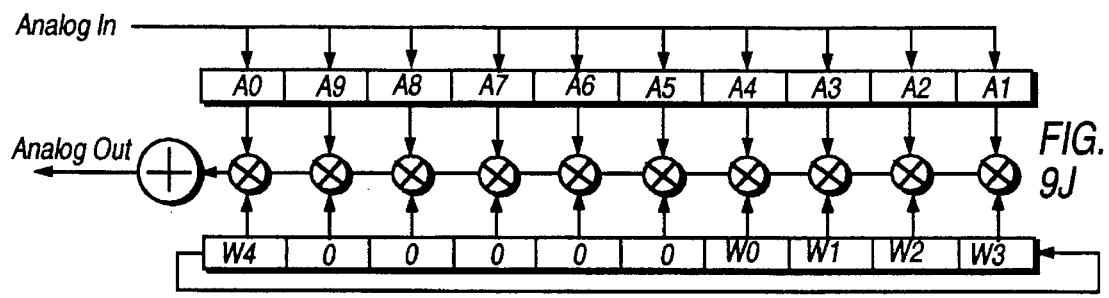

This sequence continues until FIG. 9F where the digital weight at 906 is the first non-zero weight W0 which ends the setup time for multiplier 910. The total setup time for multiplier 910 up to this point is five clock periods (the number of digital weights set to zero). Similarly, at the next clock cycle shown in FIG. 9G, the digital weight at 916 is the first non-zero weight W0 which ends the setup time for multiplier 920. The remaining FIGS. 9H–9J show the filter's progression at each sequential clock cycle. After FIG. 9J, the sequence repeats starting with FIG. 9A except that the analog input sample stored at 900 is A10. This embodiment provides a setup time of five clock cycles for each multiplier, thereby increasing the accuracy of each multiplier, without reducing the speed of the filter's clocking frequency.

While the invention has been described above with respect to specific embodiments (including capacitors, resistors, switches, transistors, and shift registers), it will be understood by those of ordinary skill in the art that various changes in form and details may be made therein without departing from the spirit and scope of the invention. For example, FIG. 5 and FIGS. 9A–9J show an embodiment in which digital weights are shifted through a digital ring shift register. An obvious variant would be a register for holding each weight with the register connected to a multiplexer for switching the connection of the register once per sampling cycle from one multiplier circuit to another.

If desired, analog weight values could be stored and used in place of digital weight values; however, such an arrangement might result in some degradation of the multiplier weight input. Such degradation could be of insignificant importance in many applications.

FIG. 6 shows an analog multiplying circuit that simultaneously converts the digital weight input to its analog value. Another obvious variant would be separate circuits for the two functions.

I claim:

1. A discrete time analog finite impulse response filter connected to receive a discrete-time succession of analog sample values x(n) representing an analog input signal comprising:

(a) N number of analog sample storage devices for storing the analog sample values x(n);

(b) N number of analog multiplying circuits, each one of the multiplying circuits having a first operand input terminal connected to an associated one of the sample storage devices, and having a second operand input terminal, and having an analog result signal output terminal, wherein a precision of each of the analog multiplying circuits increases as a corresponding setup time increases;

(c) N number of digital storage devices for storing digital weight values W(k) where $0 \leq k < N$, the weight values W(k) applied to the second operand inputs of the multiplying circuits, wherein a predetermined number of the weight values W(k) are set to zero to increase the setup time, and thereby the precision, of the analog multiplying circuits;

(d) an analog summing circuit connected to receive the analog result output signal of each multiplying circuit, having a summed analog output signal y(n); and (e) a sequencer connected to each of the analog sample storage devices for distributing the succession of analog sample values x(n) to the analog sample storage devices in a repeated sequence wherein the sequencer stores an analog sample value x(Ai) in one of the N analog storage devices for N sample time periods, and after N sample time periods the sequencer replaces the analog sample value x(Ai) by the analog sample value x(A(i+N)), the sequencer also connected to the digital weight storage devices for sequentially distributing the weight values W(k) to the analog multiplying circuits, wherein the distributing of the analog sample values x(n) is synchronized with the distributing of the weight values W(k) such that the summed analog output signal y(n) is characterized by:

$$y(n) = \sum_{k=0}^{N-1} W(k)x(n-k).$$

2. The discrete time analog finite impulse response filter as recited in claim 1, wherein:

(a) each of the analog multiplying circuits comprises M current source circuits each producing a respective output current proportional to $P^{j}*x(Ai)$ where $0 \leq j < M$; and (b) the weight values applied to the second operand input of each of the analog multiplying circuits connects a corresponding number of the current source output currents to the analog summing circuit to generate the analog output signal y(n).

3. The discrete time analog finite impulse response filter as recited in claim 2, wherein P=2.

4. The discrete time analog finite impulse response filter as recited in claim 2, wherein the current source circuit comprises a current mirror circuit.

5. The discrete time analog finite impulse response filter as recited in claim 2, wherein each current source comprises a transistor having a width/length (W/L) ratio proportional to $P^j$.

6. The discrete time analog finite impulse response filter as recited in claim 2, wherein each analog multiplying circuit further comprises M transistor switches each representing a bit of one of the digital weight values W(k) for connecting an associated current source output current to the analog summing circuit.

7. The discrete time analog finite impulse response filter as recited in claim 2, wherein the analog sample value x(Ai) and the current source output currents are differential signals.

8. The discrete time analog finite impulse response filter as recited in claim 7, wherein each analog multiplying circuit further comprises a differential switch comprising:

(a) a first input connected to receive a differential input signal VP–VN wherein a sign of an associated digital weight value W(k) determines a sign of the differential input signal VP–VN;

(b) a second input signal connected to receive at least one of the current source differential output currents; and (c) a differential output signal for outputting the at least one current source differential output current to the analog summing circuit, wherein the sign of the differential input signal VP–VN determines the sign of the differential output signal.

9. The discrete time analog finite impulse response filter as recited in claim 1, wherein the N number of digital storage devices comprises a digital ring shift register for shifting the digital weight values around the analog multiplying circuits, wherein an output of the digital ring shift register is connected to an input of the digital ring shift register.

10. The discrete time analog finite impulse response filter as recited in claim 3, wherein the digital ring shift register stores contiguously the predetermined number of the weight values W(k) set to zero.

11. A discrete time analog finite impulse response filter comprising:

(a) a plurality of analog storage devices for storing a corresponding plurality of analog sample values from a continuous time analog signal;

(b) a plurality of digital storage devices for storing a corresponding plurality of digital weight values; and (c) a plurality of analog multiplying circuits for multiplying the analog sample values by the digital weight values, wherein the precision of each of the analog multiplying circuits increases as a corresponding setup time increases;

wherein a predetermined number of the digital weight values are set to zero in order to increase the setup time, and thereby the precision, of the analog multiplying circuits.

12. The discrete time analog finite impulse response filter as recited in claim 11, wherein each of the analog multiplying circuits comprises a plurality of current source circuits each producing a respective output current proportional to $P^{j}*x(Ai)$ where j is an integer representing a bit in one of the digital weight values, P is the base of the digital weight values, and x(Ai) is one of the analog sample values.

13. The discrete time analog finite impulse response filter as recited in claim 12, wherein P=2.

14. The discrete time analog finite impulse response filter as recited in claim 12, wherein the current source circuit comprises a current mirror circuit.

15. The discrete time analog finite impulse response filter as recited in claim 12, wherein each current source comprises a transistor having a width/length (W/L) ratio proportional to $P^j$.

16. The discrete time analog finite impulse response filter as recited in claim 12, wherein each analog multiplying circuit further comprises a plurality of transistor switches each representing a bit of one of the digital weight values for connecting an associated current source output current to an analog summing circuit.

17. The discrete time analog finite impulse response filter as recited in claim 12, wherein the analog sample values and the current source output currents are differential signals.

18. The discrete time analog finite impulse response filter as recited in claim 17, wherein each analog multiplying circuit further comprises a differential switch comprising:

(a) a first input connected to receive a differential input signal VP–VN wherein a sign of an associated digital weight value W(k) determines a sign of the differential input signal VP–VN;

(b) a second input signal connected to receive at least one of the current source differential output currents; and (c) a differential output signal for outputting the at least one current source differential output current to the analog summing circuit, wherein the sign of the differential input signal VP–VN determines the sign of the differential output signal.

19. The discrete time analog finite impulse response filter as recited in claim 11, wherein the plurality of digital storage devices comprises a digital ring shift register for shifting the digital weight values around the analog multiplying circuits, wherein an output of the digital ring shift register is connected to an input of the ring digital shift register.

20. The discrete time analog finite impulse response filter as recited in claim 19, wherein the digital ring shift register stores contiguously the predetermined number of the weight values set to zero.

21. A discrete time analog finite impulse response filter comprising:

(a) a plurality of analog storage devices for storing a corresponding plurality of analog sample values from a continuous time analog signal;

(b) a plurality of digital storage devices for storing a corresponding plurality of digital weight values;

(c) a plurality of analog multiplying circuits for multiplying the analog sample values by the digital weight values, wherein each of the analog multiplying circuits comprises a plurality of current source circuits each producing a respective output current proportional to $P^j*x(Ai)$ where j is an integer representing a bit in one of the digital weight values, P is the base of the digital weight values, and x(Ai) is one of the analog sample values; and (d) an input signal for receiving a periodic clock signal for clocking the operation of the filter;

wherein:

(a) each of the analog sample values is stored in one of the analog storage devices for a predetermined number of clock periods and then replaced by a subsequent one of the analog sample values; and (b) each of the digital weight values is shifted to a different one of the digital storage devices at each clock period.

22. The discrete time analog finite impulse response filter as recited in claim 21, wherein P=2.

23. The discrete time analog finite impulse response filter as recited in claim 21, wherein the current source circuit comprises a current mirror circuit.

24. The discrete time analog finite impulse response filter as recited in claim 21, wherein each current source comprises a transistor having a width/length (W/L) ratio proportional to $P^j$.

25. The discrete time analog finite impulse response filter as recited in claim 21, wherein each analog multiplying circuit further comprises a plurality of transistor switches each representing a bit of one of the digital weight values for connecting an associated current source output current to an analog summing circuit.

26. The discrete time analog finite impulse response filter as recited in claim 21, wherein the analog sample values and the current source output currents are differential signals.

27. The discrete time analog finite impulse response filter as recited in claim 26, wherein each analog multiplying circuit further comprises a differential switch comprising:

(a) a first input connected to receive a differential input signal VP–VN wherein a sign of an associated digital weight value W(k) determines a sign of the differential input signal VP–VN;

(b) a second input signal connected to receive at least one of the current source differential output currents; and (c) a differential output signal for outputting the at least one current source differential output current to the analog summing circuit, wherein the sign of the differential input signal VP–VN determines the sign of the differential output signal.

28. A finite impulse response filter connectable to receive a discrete-time succession of analog sample values x(n) representing an analog input signal comprising:

N number of analog sample storage means for storing the sample analog values x(n);

N number of analog multiplier circuits, each one of said multiplier circuits having a first operand input terminal connected to an associated one of said sample storage means, and having a second operand input terminal, and having an analog result signal output terminal;

a weight storage means for storing N number of weight values W(k) where 0≦k<N, said weight values W(k) applied to the second operand inputs of said multiplier circuits;

an analog summing circuit connected to receive the analog result output signal of each said multiplier circuit, having a summed analog output signal y(n); and sequencing means connected to each of said analog sample storage means for distributing said succession of analog sample values x(n) to said analog sample storage means in a repeated sequence wherein the analog sample value x(n) is stored in one of the N analog storage means for N sample time periods, and after N sample time periods the analog sample value x(n) is replaced by the analog sample value x(n+N), said sequencing means also connected to said weight storage means for sequentially distributing said weight values W(k) to said multiplier circuits, wherein the distributing of the analog sample values x(n) is synchronized with the distributing of the weight values W(k) such that the summed analog output signal y(n) is characterized by:

$$y(n) = \sum_{k=0}^{N-1} W(k)x(n-k).$$

29. The finite impulse response filter of claim 28 wherein said N number of analog sample storage means is N number of capacitors.

30. The finite impulse response filter of claim 28 wherein said weight storage means comprises N digital storage cells for holding N digital words settable to said N number of weight values W(k).

31. The finite impulse response filter of claim 30 wherein said sequencing means operates to sequentially connect each said weight values W(k) to each of said second operand input terminals.

32. A signal processor comprising:

sampling means for receiving and periodically sampling an analog signal input, over a succession of time periods, thereby producing a train of discrete-time analog samples x(n);

analog sample storage means comprising N analog storage elements for holding N discrete analog samples from the train of discrete analog samples x(n);

sequencing means connected to said sampling means for distributing the discrete analog samples x(n) to said analog storage elements in a repeated sequence, wherein the analog sample value x(n) is stored in one of the N analog storage elements for N sample time periods, and after N sample time periods the analog sample value x(n) is replaced by the analog sample value x(n+N);

digital weight storage means for holding N digital words, hereinafter called N digital weights W(k), where $0 \leq k < N$, said digital weight storage means comprising N cells for holding the N digital weights W(k);

multiplying means comprising N individual multiplying circuits for multiplying each of the N discrete analog samples stored in said analog storage means by one of the N digital weights W(k), said digital weight storage means supplying one of the N digital weights to each of the individual multiplying circuits;

summing means for adding the products of said N individual multiplying circuits to produce an output signal y(n); and said sequencing means connected to said digital weight storage means for distributing the N digital weights W(k) in said digital weight storage means to the individual multiplying circuits in a repeated sequence wherein the distributing of the discrete analog sample values x(n) to the analog sample storage elements is synchronized with the distributing of the digital values W(k) to the individual multiplying circuits such that the summed analog output signal y(n) is characterized by:

$$y(n) = \sum_{k=0}^{N-1} W(k)x(n-k).$$

33. A signal processor as defined in claim 32, wherein each said sampling means for sampling said analog signal input is comprised of a solid-state analog switch, and each said analog sample storage means is comprised of a capacitor, said solid state analog switch and said capacitor connected in series between said analog signal input and ground, and wherein the value of the stored discrete-time analog signal appears at the junction of the analog switch and the capacitor.

34. A signal processor as defined in claim 32, wherein said digital weight storage means is comprised of an M by N shift register, where M is the number of digits in each digital word (weight) and N is the number of words contained in the N cells of the shift register, and wherein the input and output terminals of the shift register are connected such that the word in the last cell of the shift register returns to the first cell after each shift, and wherein each of the N cells is connected to one of said multiplier circuits, and further wherein said sequencing means is connected to said shift register for synchronizing the shifting of the weights from cell to cell with each sample time period.

35. A signal processor as defined in claim 32, wherein said sequencing means generates timing signals, said timing signals including a signal for activating each said analog switch and a signal for clocking said shift register.

36. A signal processor as defined in claim 32, wherein each of said individual multiplying circuits includes an analog multiplicand input terminal, an analog product output terminal and M digital multiplier input terminals, and wherein each individual multiplying circuit further includes:

means for converting an analog voltage signal to an input current signal;

network means for dividing said input current signal into M lines, said network including means for selecting a portion of said M lines to provide the product signal of said individual multiplying circuit.

37. The signal processor of claim 36 wherein said network is an R/2R ladder network comprised of field effect transistors.

38. The signal processor of claim 37 further including:

M latch means connected to said digital weight storage elements and to said network, said latch means holding an M bit digital word for determining the selection of said M lines.

39. The signal processor of claim 37 wherein said multiplying circuit further includes an output buffer amplifier connected to said ladder network for isolating said ladder network from the effects of a load.

40. The signal processor of claim 32 wherein:

each said sampling means for sampling said analog signal input is comprised of a solid-state analog switch, and each said analog sample storage means is comprised of a capacitor, said solid state analog switch and said capacitor connected in series between said analog signal input and ground, and wherein the value of the stored discrete-time analog signal appears at the junction of the analog switch and the capacitor;

said digital weight storage means is comprised of an M by N shift register, where M is the number of digits in each digital word (weight) and N is the number of words contained in the N cells of the shift register, and wherein the input and output terminals of the shift register are connected such that the word in the last cell of the shift register returns to the first cell after each shift, and wherein each of the N cells is connected to one of said multiplier circuits, and further wherein said sequencing means is connected to said shift register for synchronizing the shifting of the weights from cell to cell with each sample time period;

said sequencing means generates timing signals, said timing signals including a signal for activating each said analog switch and a signal for clocking said shift register; and each of said individual multiplying circuits includes an analog multiplicand input terminal, an analog product output terminal and M digital multiplier input terminals, and wherein each individual multiplying circuit further includes:

means for converting an analog voltage signal to an input current signal;

network means for dividing said input current signal into M lines, said network including means for selecting a portion of said M lines to provide the product signal of said individual multiplying circuit wherein said network is an R/2R ladder network comprised of field effect transistors and wherein said multiplying circuit further includes an output buffer amplifier connected to said ladder network for isolating said ladder network from the effects of a load, and further including M latch means connected to said shift register for receiving and storing said M number of digits from one of said N cells, said latch means also connected to said network for supplying said M number of digits to selectively gate said field effect transistor.

41. The signal processor defined in claim 40, wherein said multiplying circuit further includes an output buffer amplifier connected to said ladder network for isolating said ladder network from the effects of a load.

42. A finite impulse response filter connectable to receive a discrete-time succession of analog sample values x(n) representing an analog input signal comprising:

N number of analog sample storage elements storing the sample analog values x(n);

N number of analog multiplier circuits, each one of said multiplier circuits having a first operand input terminal connected to an associated one of said sample storage means, and having a second operand input terminal, and having an analog result signal output terminal;

weight storage elements storing N number of weight values W(k) where 0≦k<N, said weight values W(k) applied to the second operand inputs of said multiplier circuits;

an analog summing circuit connected to receive the analog result output signal of each said multiplier circuit, having a summed analog output signal y(n); and a sequencer connected to each of said analog sample storage means for distributing said succession of analog sample values x(n) to said analog sample storage elements in a repeated sequence wherein the analog sample value x(n) is stored in one of the N analog storage elements for N sample time periods, and after N sample time periods the analog sample value x(n) is replaced by the analog sample value x(n+N), said sequencer also connected to said weight storage elements sequentially distributing said weight values W(k) to said multiplier circuits, wherein the distributing of the analog sample values x(n) is synchronized with the distributing of the weight values W(k) such that the summed analog output signal y(n) is characterized by:

$$y(n) = \sum_{k=0}^{N-1} W(k)x(n-k).$$

43. A signal processor comprising:

sampling elements receiving and periodically sampling an analog signal input, over a succession of time periods, thereby producing a train of discrete-time analog samples x(n);

N analog storage elements holding N discrete analog samples from the train of discrete analog samples x(n);

a sequencer connected to said sampling elements distributing the discrete analog samples x(n) to said analog storage elements in a repeated sequence, wherein the analog sample value x(n) is stored in one of the N analog storage elements for N sample time periods, and after N sample time periods the analog sample value x(n) is replaced by the analog sample value x(n+N);

digital weight storage elements holding N digital words, hereinafter called N digital weights W(k), where 0≦k<N, said digital weight storage elements comprising N cells for holding the N digital weights W(k);

N individual multiplying circuits multiplying each of the N discrete analog samples stored in said analog storage elements by one of the N digital weights W(k), said digital weight storage elements supplying one of the N digital weights to each of the individual multiplying circuits;

a summing circuit adding the products of said N individual multiplying circuits to produce an output signal y(n); and said sequencer connected to said digital weight storage elements distributing the N digital weights W(k) in said digital weight storage elements to the individual multiplying circuits in a repeated sequence wherein the distributing of the discrete analog sample values x(n) to the analog sample storage elements is synchronized with the distributing of the digital values W(k) to the individual multiplying circuits such that the summed analog output signal y(n) is characterized by:

$$y(n) = \sum_{k=0}^{N-1} W(k)x(n-k).$$

44. A method for processing analog electrical signals comprising the steps of:

receiving an analog signal input;

periodically sampling said analog signal input over a succession of sample time periods thereby producing a train of discrete-time analog samples x(n);

receiving and storing, in N number of analog memory elements, N discrete-time samples from said train of discrete-time analog samples x(n);

replacing each of the N stored discrete-time analog sample values in a repeated sequence with analog sample values from said train of discrete-time analog samples x(n) once every N sample time periods, wherein the analog sample value x(n) is stored for N sample time periods, and after N sample time periods the analog sample value x(n) is replaced by the analog sample value x(n+N);

storing, in a weight storage memory, N values hereinafter called weights W(k) where 0≦k<N;

forming N analog products, using N analog multiplier circuits, by multiplying each of the N stored discrete-time analog sample values by one of the N weights W(k), wherein a different one of the N weights is sequentially accessible by each one of said multiplier circuits on each sample time period;

producing a train of discrete-time analog output signals y(n) by summing said N analog products once each sample period using an analog summing circuit; and synchronizing and sequencing the sampling of the analog signal input x(t), the replacing of the stored discrete-time analog samples x(n), the sequential accessing of the digital weights W(k), and the forming and summing of N analog products such that the discrete-time analog output signal y(n) is characterized by:

$$y(n) = \sum_{k=0}^{N-1} W(k)x(n-k).$$

45. The method of claim 44 wherein the steps of storing and replacing analog sample values includes sequentially connecting N analog memory elements directly to sample values from said train of discrete-time analog sample values x(n).

46. A method for processing electrical signals as defined in claim 45, wherein the step of sampling said analog signal input is performed by N solid-state analog switches.

47. A method for processing electrical signals as defined in claim 46, wherein said N number of analog memory elements is comprised of N capacitors.

48. A method for processing electrical signals as defined in claim 44, wherein the step of storing N values in a weight storage memory includes a digital weight storage memory comprised of an M by N shift register, where M is the number of digits in each digital word (weight) and N is the number of words contained in the N cells of the shift register, and wherein the input and output terminals of the shift register are connected such that the word in the last cell of the shift register returns to the first cell after each shift, and wherein each of the N cells is connected to one of said multiplier means, and further wherein the step of synchronizing and sequencing the shifting of the weights from cell to cell in said shift register is synchronized with each sample time period.

* * * * *

UNITED STATES PATENT AND TRADEMARK OFFICE
CERTIFICATE OF CORRECTION

PATENT NO. : 5,563,819
DATED : October 8, 1996
INVENTOR(S) : David A. Nelson

It is certified that error appears in the above-indentified patent and that said Letters Patent is hereby corrected as shown below:

Column 11, line 45:   Replace the equation

"$Id=(½)K(W/L)(Vgs-Vt)^2(1-AVds)$"

with the following:

--$Id=(½)K(W/L)(Vgs-Vt)^2(1-\acute{A}Vds)$--;

Column 14, line 19:   Replace "3" with --9--.

Signed and Sealed this

Fourth Day of March, 1997

*Attest:*

BRUCE LEHMAN

*Attesting Officer*      Commissioner of Patents and Trademarks